US012604581B2

(12) United States Patent
Wu et al.

(10) Patent No.: US 12,604,581 B2
(45) Date of Patent: Apr. 14, 2026

(54) METHOD FOR MANUFACTURING ELECTRONIC DEVICE

(71) Applicant: InnoLux Corporation, Miao-Li County (TW)

(72) Inventors: Yuan-Lin Wu, Miao-Li County (TW); Tsung-Han Tsai, Miao-Li County (TW); Jia-Yuan Chen, Miao-Li County (TW); Kuan-Feng Lee, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 945 days.

(21) Appl. No.: 17/864,369

(22) Filed: Jul. 13, 2022

(65) Prior Publication Data

US 2023/0048771 A1     Feb. 16, 2023

(30) Foreign Application Priority Data

Aug. 11, 2021    (CN) .......................... 202110919883.6

(51) Int. Cl.
| | |
|---|---|
| *H10H 20/857* | (2025.01) |
| *H10H 20/01* | (2025.01) |
| *H10H 20/852* | (2025.01) |

(52) U.S. Cl.
CPC ........ H10H 20/857 (2025.01); H10H 20/852 (2025.01); *H10H 20/0362* (2025.01); *H10H 20/0364* (2025.01)

(58) Field of Classification Search
CPC ............... H10H 20/857; H10H 20/852; H10H 20/0362; H01L 25/167; H01L 25/0753; H10K 2102/311; H10K 77/111; H10D 86/0214; H10D 86/411; H10D 86/60
See application file for complete search history.

(56) References Cited

U.S. PATENT DOCUMENTS

| | | | | |
|---|---|---|---|---|
| 9,076,736 B2 * | 7/2015 | Huang | .............. | H01L 21/31144 |
| 10,541,380 B1 * | 1/2020 | Sung | .................... | H10K 59/40 |
| 2018/0260053 A1 * | 9/2018 | Hong | .................... | G06F 3/0446 |
| 2019/0035719 A1 * | 1/2019 | Daitoku | .............. | H05K 3/4007 |
| 2019/0074345 A1 * | 3/2019 | Lee | .................... | H10K 59/8731 |
| 2020/0127217 A1 * | 4/2020 | Bae | ........................ | G06F 1/1652 |
| 2020/0413544 A1 | 12/2020 | Gao | | |
| 2022/0416127 A1 * | 12/2022 | Choi | .................. | H01L 25/0753 |

FOREIGN PATENT DOCUMENTS

| | | |
|---|---|---|
| CN | 112153811 A | 12/2020 |
| CN | 112186023 A | 1/2021 |
| CN | 112530864 A | 3/2021 |
| TW | 201006334 | 2/2010 |
| TW | 201006335 | 2/2010 |
| TW | 202127607 A | 7/2021 |

* cited by examiner

*Primary Examiner* — Ajay Ojha
*Assistant Examiner* — Bipana Adhikari Dawadi
(74) *Attorney, Agent, or Firm* — Winston Hsu

(57)     ABSTRACT

A method for manufacturing an electronic device includes: providing a base layer; forming a patterned circuit layer on the base layer, the patterned circuit layer having a first opening; placing an electronic element on the patterned circuit layer; and patterning the base layer to form a second opening which is at least partially overlapped with the first opening. The step of placing the electronic element is performed after the step of forming the patterned circuit layer.

12 Claims, 18 Drawing Sheets

METHOD FOR MANUFACTURING ELECTRONIC DEVICE

BACKGROUND OF THE DISCLOSURE

1. Field of the Disclosure

The present disclosure relates to a method for manufacturing an electronic device, and more particularly to a method for manufacturing a stretchable electronic device.

2. Description of the Prior Art

In recent years, display devices have become more and more important in various electronic applications, such as vehicle displays, wearable devices (e.g., smart watches), smart phones, tablets, notebook computers and e-book readers. Electronic manufacturers keeps on researching and developing new type display devices. Among these devices, stretchable electronic devices are electronic devices that can be stretched in a specific direction. However, in the manufacturing process of a stretchable electronic device, the elasticity of its structure may cause problems in the arrangement or alignment of elements, which may lead to a decrease of the quality of the displayed images.

SUMMARY OF THE DISCLOSURE

One of objectives of the present disclosure is to provide a method for manufacturing an electronic device, so as to solve the problems encountered by the conventional manufacturing methods of electronic devices, thereby improving the qualification rate and stability of the process.

An embodiment of the present disclosure provides a method for manufacturing an electronic device. The method includes: providing a base layer; forming a patterned circuit layer on the base layer, the patterned circuit layer having a first opening; placing an electronic element on the patterned circuit layer; and patterning the base layer to form a second opening which is at least partially overlapped with the first opening. The step of placing the electronic element is performed after the step of forming the patterned circuit layer.

These and other objectives of the present disclosure will no doubt become obvious to those of ordinary skill in the art after reading the following detailed description of the embodiment that is illustrated in the various figures and drawings.

DETAILED DESCRIPTION

The present disclosure may be understood by reference to the following detailed description, taken in conjunction with the drawings as described below. It is noted that, for purposes of illustrative clarity and being easily understood by the readers, various drawings of this disclosure show a portion of the device, and certain components in various drawings may not be drawn to scale. In addition, the number and dimension of each component shown in drawings are only illustrative and are not intended to limit the scope of the present disclosure.

Certain terms are used throughout the description and following claims to refer to particular components. As one skilled in the art will understand, electronic equipment manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . .". When the terms "include", "comprise" and/or "have" are used in the description of the present disclosure, the corresponding features, areas, steps, operations and/or components would be pointed to existence, but not limited to the existence or addition of one or a plurality of the corresponding or other features, areas, steps, operations and/or components.

When an element or layer is referred to as being "on" or "connected to" another element or layer, it may be directly on or directly connected to the other element or layer, or intervening elements or layers may be presented (indirect condition). In contrast, when an element is referred to as being "directly on" or "directly connected to" another element or layer, there are no intervening elements or layers presented.

The terms "about", "equal", "identical" or "the same", and "substantially" or "approximately" mentioned in this document generally mean being within 20% of a given value or range, or being within 10%, 5%, 3%, 2%, 1% or 0.5% of a given value or range.

In the present disclosure, "stretched/stretchable" means that when external pressure and/or external force is applied to an object, the object may be deformed, and this deformation may include the variation in the area, length, width and/or curvature of the object in any direction(s), but not limited herein. For example, the increase or decrease in the length of an object may be "stretched/stretchable" according to the present disclosure.

It should be noted that the technical features in different embodiments described in the following can be replaced, recombined, or mixed with one another to constitute another embodiment without departing from the spirit of the present disclosure.

Figure 1:
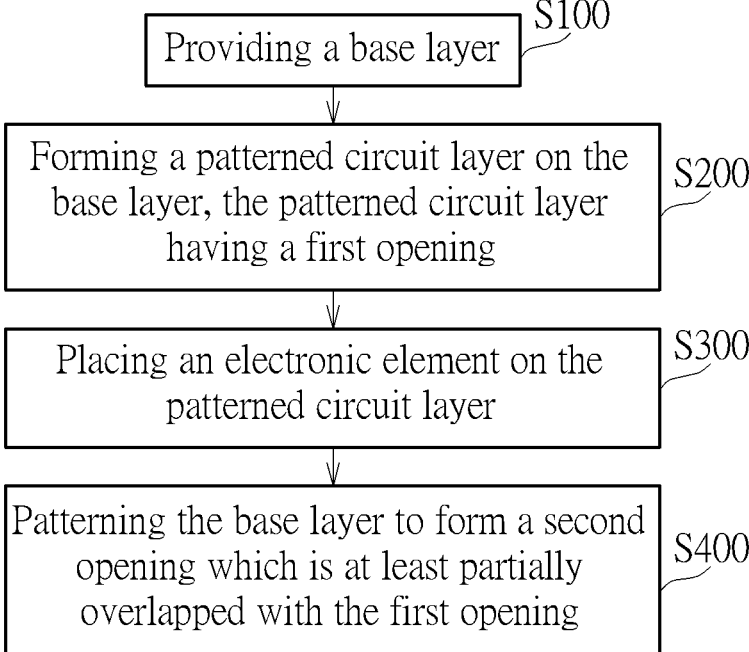
FIG. 1 is a flowchart of a method for manufacturing an electronic device according to an embodiment of the present disclosure.
Figure 2:
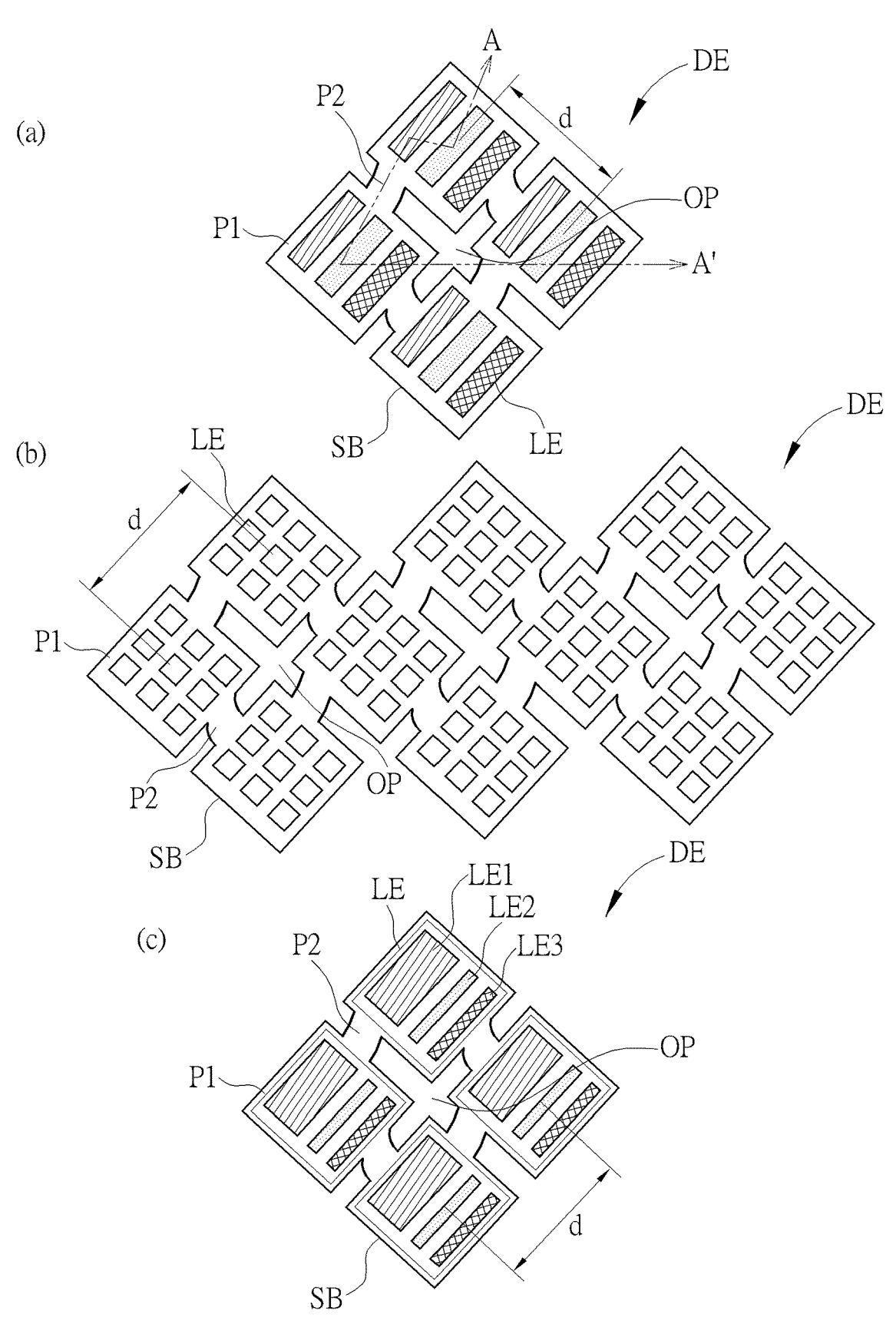
FIG. 2 is a partial top-view schematic diagram of an electronic device according to different embodiments of the present disclosure.
Figure 8:
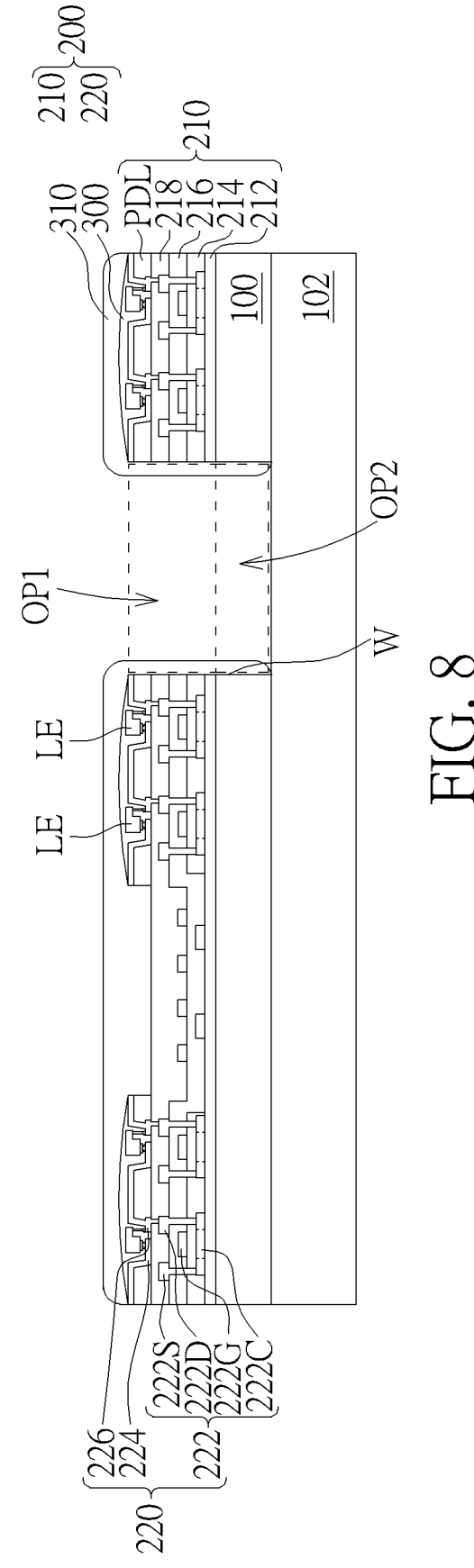
Figure 9:
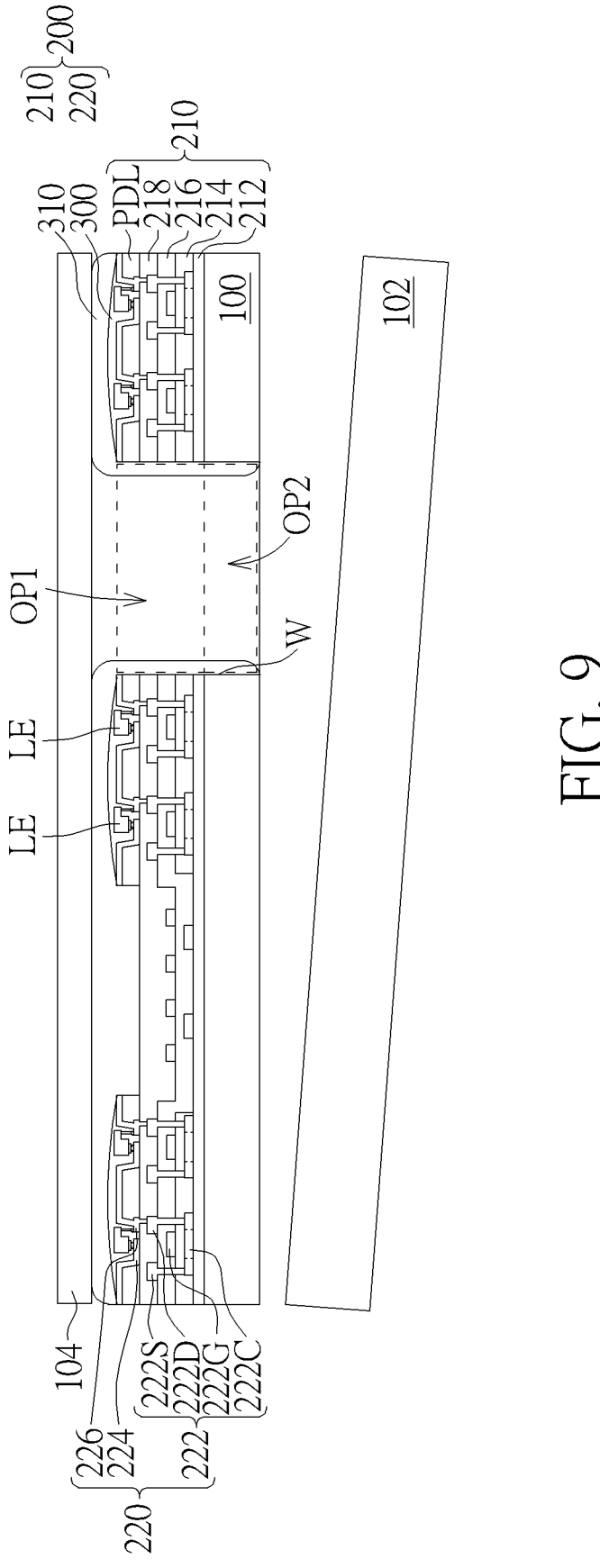
Figure 10:
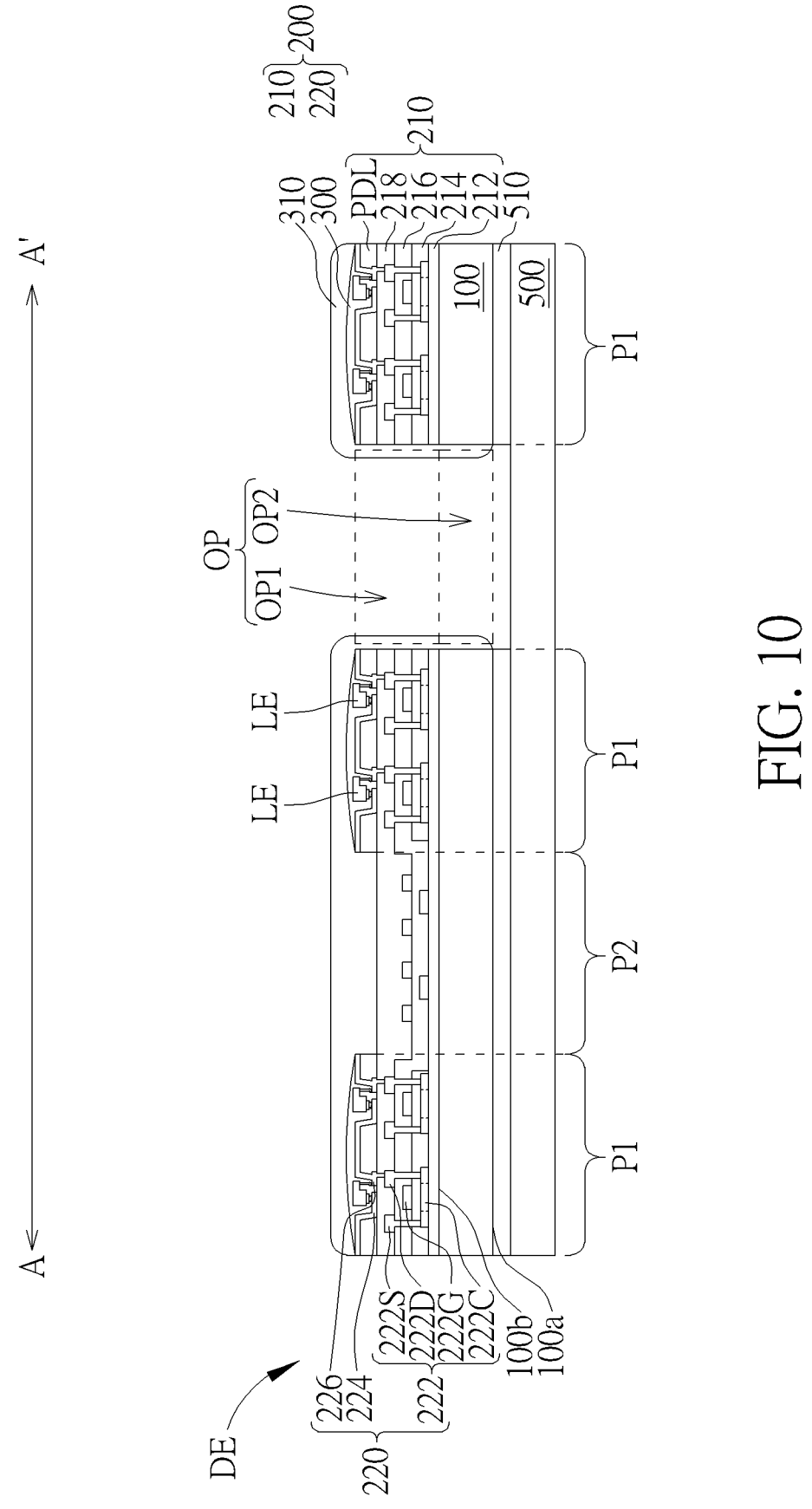

Please refer to FIG. 1, FIG. 2 and FIG. 3 to FIG. 10. FIG. 1 is a flowchart of a method for manufacturing an electronic device according to an embodiment of the present disclosure. FIG. 2 is a partial top-view schematic diagram of an electronic device according to different embodiments of the present disclosure. FIG. 3 to FIG. 10 are schematic diagrams illustrating the process of a method for manufacturing an electronic device according the present disclosure, and FIG. 3 to FIG. 10 are process schematic diagrams showing the sectional views of the structure along a sectional line A-A' of example (a) of FIG. 2. As shown in FIG. 2 and FIG. 10, the example (a), example (b) and example (c) of FIG. 2 show the partial structures of electronic devices DE of different embodiments manufactured by the present disclosure, and the electronic device DE of each example may be a stretchable electronic device and include a stretchable substrate SB. As shown in FIG. 10, the stretchable substrate SB may include, for example, an elastic substrate 500, an adhesive layer 510, a base layer 100 and a patterned circuit layer 200. In some embodiments, the electronic device DE may include a display device, a sensing device, a tiled device or an antenna device, but not limited herein.

As shown in FIG. 2, the stretchable substrate SB has a plurality of island portions P1 and a plurality of connecting portions P2. The connecting portions P2 are connected to the adjacent island portions P1, and a substrate opening OP may be formed from being surrounded by the adjacent island portions P1 and connecting portions P2. As shown in FIG. 10, the substrate opening OP may be formed of a first opening OP1 and a second opening OP2. The first opening OP1 may be an opening of the patterned circuit layer 200, and the second opening OP2 may be an opening of the base layer 100, which will be described in detail in the following paragraphs. One or plural electronic element(s) LE may be disposed on these island portions P1, and the electronic element(s) LE may be, for example, light-emitting elements, sensing elements or antenna elements, but not limited herein. In some embodiments, as shown in example (a) of FIG. 2, for example, three electronic elements LE may be disposed on one island portion P1, the three electronic elements LE may be a red light-emitting element, a green light-emitting element and a blue light-emitting element respectively, but not limited therein. In some embodiments, as shown in example (b) of FIG. 2, for example, a plurality of electronic elements LE may be disposed on one island portion P1, and the plurality of electronic elements LE may include light-emitting elements of different colors or the same color, but not limited herein. In some embodiments, as shown in example (b) of FIG. 2, for example, a plurality of electronic elements LE may be disposed on one island portion P1, and the plurality of electronic elements LE may include light-emitting elements of the same color, but not limited herein.

As shown in FIG. 1, FIG. 2 and FIG. 3 to FIG. 10, a method for manufacturing the electronic device DE according to an embodiment of the present disclosure may include the following steps.

Figure 3:
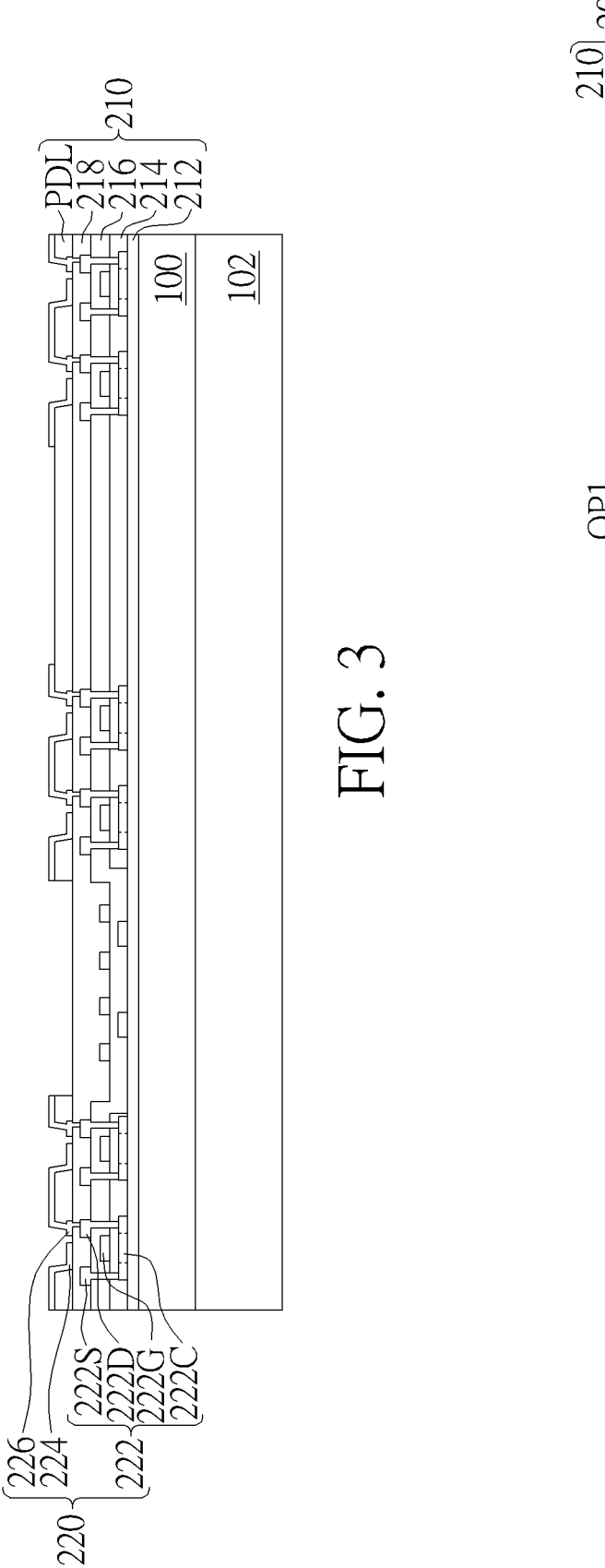
FIG. 3 to FIG. 10 are schematic diagrams illustrating the process of a method for manufacturing an electronic device according the present disclosure.

Step S100: A base layer 100 is provided, as shown in FIG. 3. The base layer 100 has a lower surface 100a and an upper surface 100b. The base layer 100 may include soft or flexible materials, such as polyimide (PI), polycarbonate (PC), polyethylene terephthalate (PETs), other suitable materials or any combination of the above materials. In some embodiments, a carrier 102 may further be provided, and the base layer 100 may be attached on the carrier 102, so that the base layer 100 may be disposed on the carrier 102 first, but not limited herein.

Figure 4:
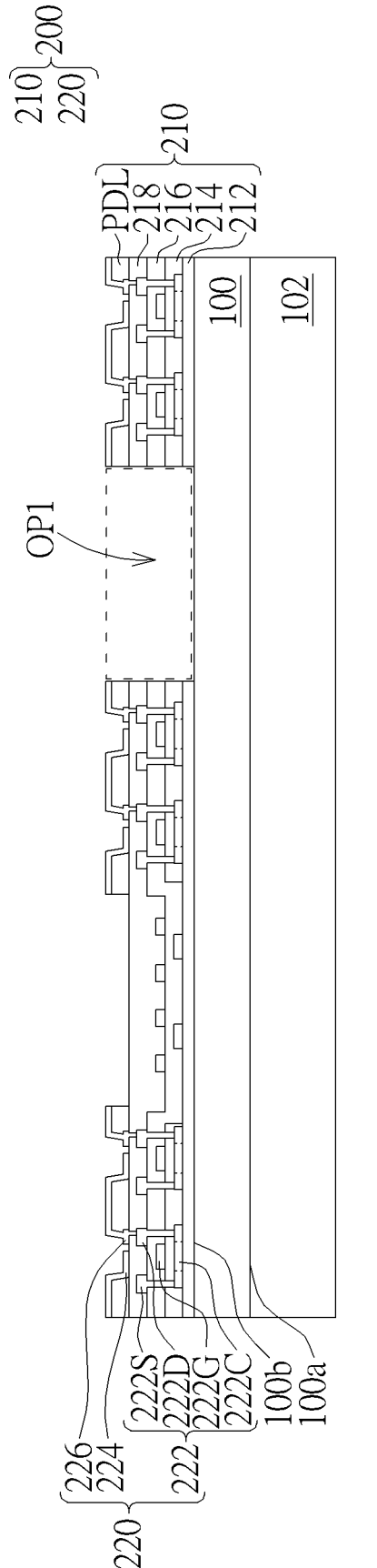

Step S200: A patterned circuit layer 200 is formed on the base layer 100, and the patterned circuit layer 200 has a first opening OP1, as shown in FIG. 4. The patterned circuit layer 200 may be disposed on the upper surface 100b of the base layer 100. For example, a circuit layer may be formed by a thin film process, wherein the circuit layer may include active elements or passive elements (e.g., thin film transistors or capacitors), and then the circuit layer is patterned by a photolithography process (e.g. an etching process) to form the patterned circuit layer 200, but not limited herein. Specifically, the circuit layer may include a plurality of insulation layers (represented by an insulation layer 210) and a plurality of conductive layers (represented by an element conductive layer 220), and the first opening OP1 formed after the circuit layer is patterned may be an opening formed by a plurality of insulation layers. For example, as shown in FIG. 4, the first opening OP1 may be an opening formed by an insulation layer 212 (e.g., a buffer layer), an insulation layer 214, an insulation layer 216, an insulation layer 218 and a pixel definition layer PDL. According to some embodiments, the first opening OP1 may be an opening of one or plural insulation layers. According to some embodiments, the first opening OP1 may expose the base layer 100, but not limited herein. According to some embodiments, the first opening OP1 may expose any one of the plural insulation layers described above without exposing the base layer 100.

Figures 5, 6:
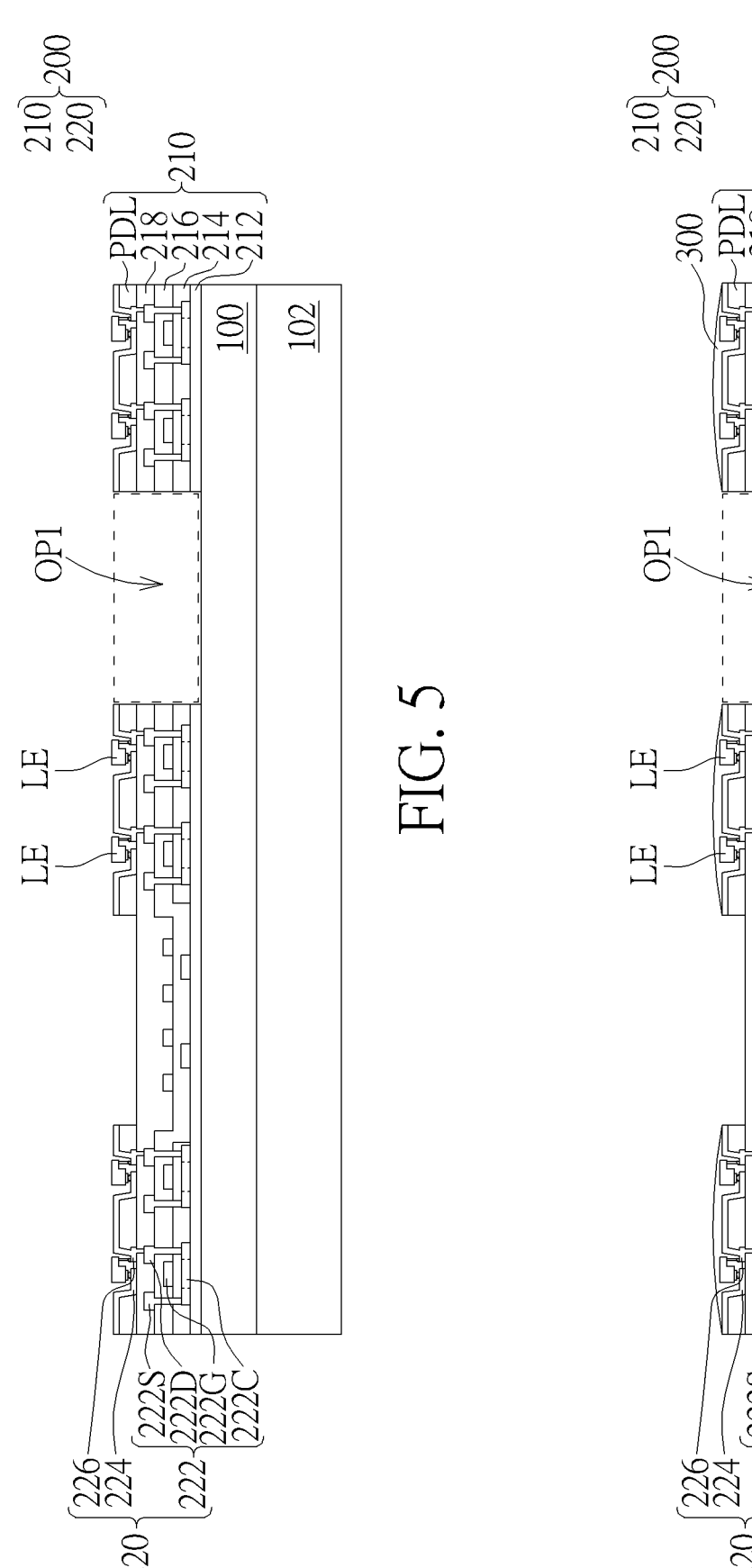

Step S300: An electronic element LE is disposed on the patterned circuit layer 200, as shown in FIG. 5. Specifically, a plurality electronic elements LE may be disposed on the patterned circuit layer 200. The electronic element LE may include a light-emitting diode (LED), such as a micro light-emitting diode (micro LED), an integrated light-emitting diode (integrated LED), a mini light-emitting diode (mini LED) or other suitable electronic elements, but not limited herein. According to some embodiments, the electronic element LE is a micro LED with an arrangement in collation with the stretchable substrate SB, and the electronic device DE may have higher reliability because its packaging may be easier and the area of the elements may be smaller. The placing method of the electronic element LE may include, for example, transferring the electronic element LE to the patterned circuit layer 200 by a mass transfer method such as a pick and place method or a fluid method, and then placing the electronic element LE on the patterned circuit layer 200 by heating and pressurizing, but not limited herein. The step S300 of placing the electronic element LE may be performed after the step S200 of forming the patterned circuit layer 200, so that the problem that the electronic element LE is damaged due to the patterning process (such as etching) may be reduced. According to some embodiments, the electronic element LE is placed on the patterned circuit layer 200 after the patterned circuit layer 200 is formed, thereby mitigating the adverse effects of the patterning process on the electronic element LE when forming the patterned circuit layer 200, so that the manufactured stretchable electronic device may have a better qualification rate.

Figure 7:
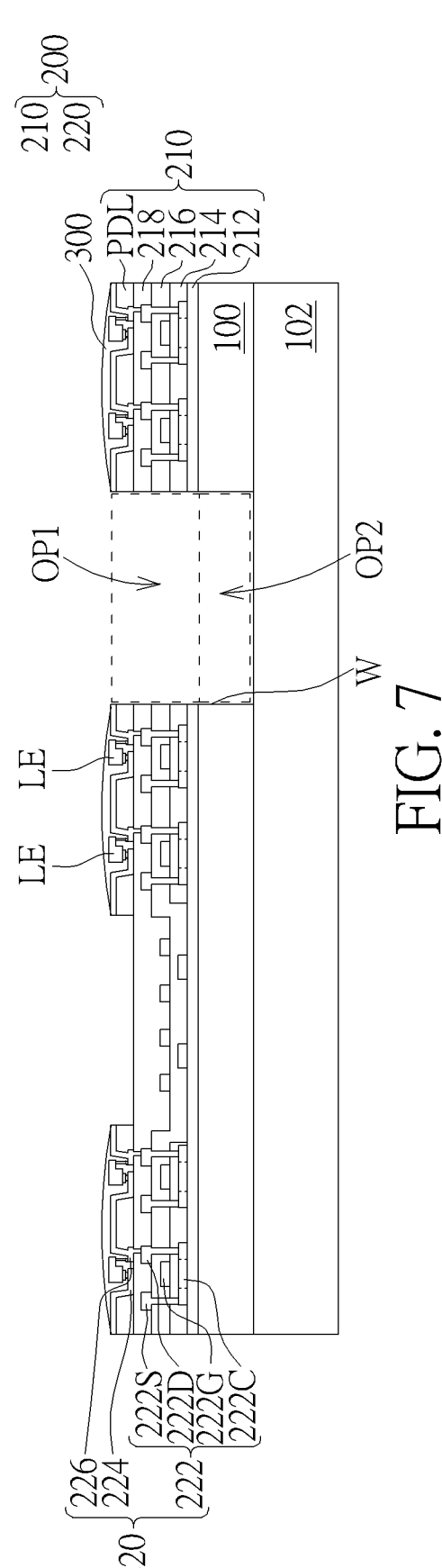

Step S400: The base layer 100 is patterned to form a second opening OP2 which is at least partially overlapped with the first opening OP1, as shown in FIG. 7. The base layer 100 may be patterned by a process such as laser drilling, punch or chemical etching, but not limited herein. In some embodiments, the first opening OP1 may be communicated with the second opening OP2, which means that the first opening OP1 and the second opening OP2 are connected with each other. The first opening OP1 and the second opening OP2 may form the substrate opening OP (shown in FIG. 2). In some embodiments, the first opening OP1 may not be communicated with the second opening OP2. The first opening OP1 and the second opening OP2 may be aligned or misaligned with each other.

In some embodiments, the insulation layer 210 and the base layer 100 may be patterned by different processes. That is to say, the first opening OP1 and the second opening OP2 may be formed by different processes. In some embodiments, the insulation layer 210 may be patterned by an etching process, and the base layer 100 may be patterned by a laser drilling process or a punch process. In some embodiments, the first opening OP1 and the second opening OP2 may be formed at different time stages. Through forming the first opening OP1 and the second opening OP2 by separate steps and different processes, the problem of particle splashing during the process of forming openings may be reduced, and the damage to the electronic element LE may be reduced, thereby improving the qualification rate and stability of the process of the electronic device.

In some embodiments, the first opening OP1 of the patterned circuit layer 200 may be formed by forming an opening in the insulation layer 210 at once. As shown in FIG. 3 and FIG. 4, the step of forming the patterned circuit layer 200 may include the following sub-steps. The insulation layer 210 is formed on the base layer 100, and a patterned conductive layer (including an electrode connection layer 224 and an electrode connection layer 226) is formed on the insulation layer 210. The insulation layer 210 is patterned to form at least a part of the first opening OP1 after the step of forming the patterned conductive layer. The insulation layer 210 may include an insulation layer 212 (e.g., a buffer layer), an insulation layer 214, an insulation layer 216, an insulation layer 218 and a pixel definition layer PDL. The element conductive layer 220 may include one or more thin film transistor(s) 222, an electrode connection layer 224, an electrode connection layer 226 and wires (not shown). The thin film transistor 222 is used as a switch element or a driving element, for example. The thin film transistor 222 may include a channel layer 222C, a gate 222G, a source 222S and a drain 222D, but not limited herein. The stack of layers of the thin film transistor 222 shown in FIG. 3 is only is only one of the examples, and the present disclosure is not limited herein. The thin film transistor 222 suitable for the present disclosure may be a top gate type or a bottom gate type.

In detail, as shown in FIG. 3, the insulation layer 212 may be disposed on the base layer 100, the channel layer 222C is disposed on the insulation layer 212, the insulation layer 214 is disposed on the channel layer 222C, the gate 222G is disposed on the insulation layer 214, the insulation layer 216 is disposed on the gate 222G, the source 222S and the drain 222D are disposed on the insulation layer 216 and electrically connected to the channel layer 222C respectively. the insulation layer 218 is disposed on the source 222S and the drain 222D, the pixel definition layer PDL is disposed on the insulation layer 218, and the electrode connection layer 224 and the electrode connection layer 226 are disposed on the pixel definition layer PDL, but not limited herein. Then, as shown in FIG. 4, after the pixel definition layer PDL, the electrode connection layer 224 and the electrode connection layer 226 located at the top of the stack of layers are formed, the opening is formed in the insulation layer 210 including the insulation layer 212, the insulation layer 214, the insulation layer 216, the insulation layer 218 and the pixel definition layer PDL at once, which means the openings in all of these insulation layers are formed simultaneously, so as to form the first opening OP1 of the patterned circuit layer 200, but not limited herein.

In some embodiments, as shown in FIG. 5 to FIG. 7, the step S400 of patterning the base layer 100 may be performed after the step S300 of placing the electronic element LE, but the present disclosure is not limited herein. That is to say, the second opening OP2 which is at least partially overlapped and communicated with the first opening OP1 is formed after the electronic element LE is placed. As shown in FIG. 5, the electronic element LE is placed on the patterned circuit layer 200. Specifically, the electronic element LE may be electrically connected to the thin film transistor 222. For example, the electronic element LE may be electrically connected to the thin film transistor 222 through connection layers (e.g. the electrode connection layer 224 and/or the electrode connection layer 226). Since heating and pressurizing are performed during the process of placing the electronic element LE on the patterned circuit layer 200, it is easier to reduce the strength of the structure if the base layer 100 has been patterned, resulting in poor support of the base layer 100, which may affect the qualification rate of placing the electronic element LE on the patterned circuit layer 200. Therefore, according to some embodiments, through patterning the base layer 100 to form the second opening OP2 after placing the electronic element LE, the structure may have better support during the process of placing the electronic element LE. In addition, through patterning the thicker base layer 100 at a later stage, the process height difference may be smaller, and the uniformity of film thickness may be increase. In some embodiments, as shown in FIG. 6, the method of the present disclosure may further include forming an encapsulation layer 300 on the electronic element LE before the step S400 of patterning the base layer 100. The encapsulation layer 300 may include organic materials, inorganic materials or a stacking structure of organic and inorganic materials, but not limited herein. A portion of the encapsulation layer 300 may be partially located above the electronic element LE to cover and protect the electronic element LE.

In some embodiment, as shown in FIG. 8, the method of the present disclosure may further include forming an encapsulation layer 310 (or referred to as a second encapsulation layer) on the electronic element LE and the a sidewall W of the first opening OP1 and the second opening OP2 to protect and cover the electronic element LE and the patterned circuit layer 200 after the step S400 of patterning the base layer 100 (as shown in FIG. 7). The encapsulation layer 310 may include organic materials, inorganic materials or a stacking structure of organic and inorganic materials, but not limited herein. The encapsulation layer 300 and the encapsulation layer 310 may be formed by a chemical vapor deposition (CVD) coating process or a coating process, but not limited herein. The encapsulation layer 310 and the encapsulation layer 300 may include the same material or different materials.

As shown in FIG. 9 and FIG. 10, after the encapsulation layer 310 is formed (as shown in FIG. 8), the method for manufacturing the electronic device of the present disclosure may further include the following steps. A sub-carrier 104 is placed on the electronic element LE, and then the carrier 102 is removed. Next, an elastic substrate 500 is attached under the base layer 100, and the sub-carrier 104 is removed, thereby forming the electronic device DE as shown in FIG. 10. As shown in FIG. 10, the elastic substrate 500 is attached to the lower surface 100a of the base layer 100. The Young's modulus of the elastic substrate 500 may be less than the Young's modulus of the base layer 100. For example, the Young's modulus of the base layer 100 may range from about 3000 to 4000 MPa, and the Young's modulus of the elastic substrate 500 may be less than 3000 MPa, but not limited herein. The material of the elastic substrate 500 may include, for example, polydimethylsiloxane (PDMS), poly (methyl methacrylate) (PMMA), polylactic acid (PLA) or acrylonitrile butadiene styrene (ABS), but not limited herein. Specifically, as shown in FIG. 9, the sub-carrier 104 may be placed on the encapsulation layer 310 covering the electronic element LE and the patterned circuit layer 200 after the encapsulation layer 310 is formed. For example, the sub-carrier 104 may be attached to the surface of the encapsulation layer 310. Then, the carrier 102 may be removed. Next, as shown in FIG. 10, the elastic substrate 500 is attached under the base layer 100. For example, an adhesive layer 510 may be formed on the elastic substrate 500 first, and then the elastic substrate 500 is attached to the lower surface 100a of the base layer 100 through the adhesive layer 510. The lower surface 100a of the base layer 100 is opposite to the upper surface 100b of the base layer 100, and the patterned circuit layer 200 is disposed on the upper surface 100b of the base layer 100. According to some embodiments, as shown in FIG. 10, the adhesive layer 510 may not be provided at the place corresponding to the second opening OP2 of the base layer 100. Then, the sub-carrier 104 may be removed, thereby forming the electronic device DE as shown in FIG. 10.

Figures 17, 18:
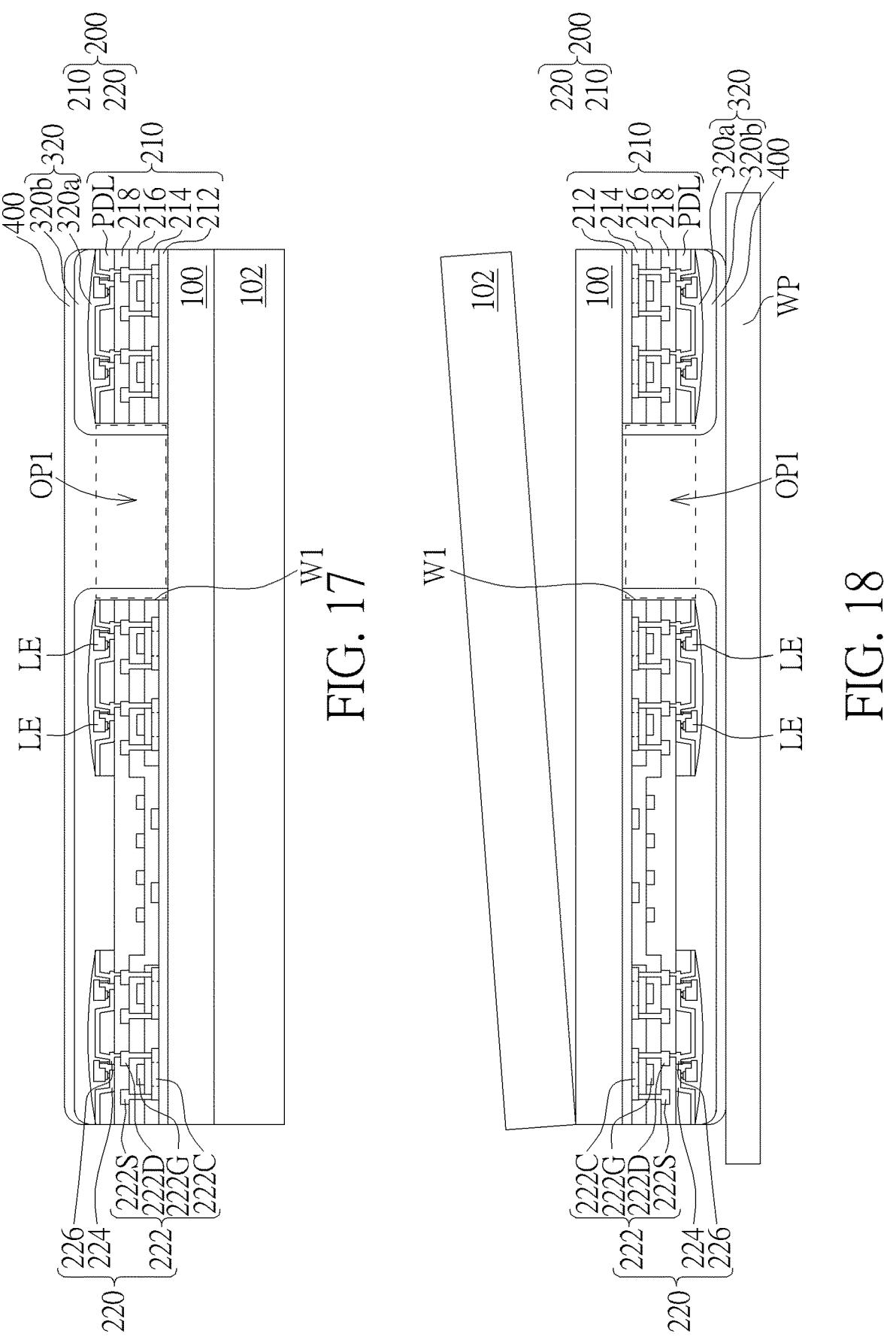
FIG. 17 to FIG. 20 are process schematic diagrams illustrating another part of the process of a method for manufacturing an electronic device according the present disclosure.
Figures 26, 27:
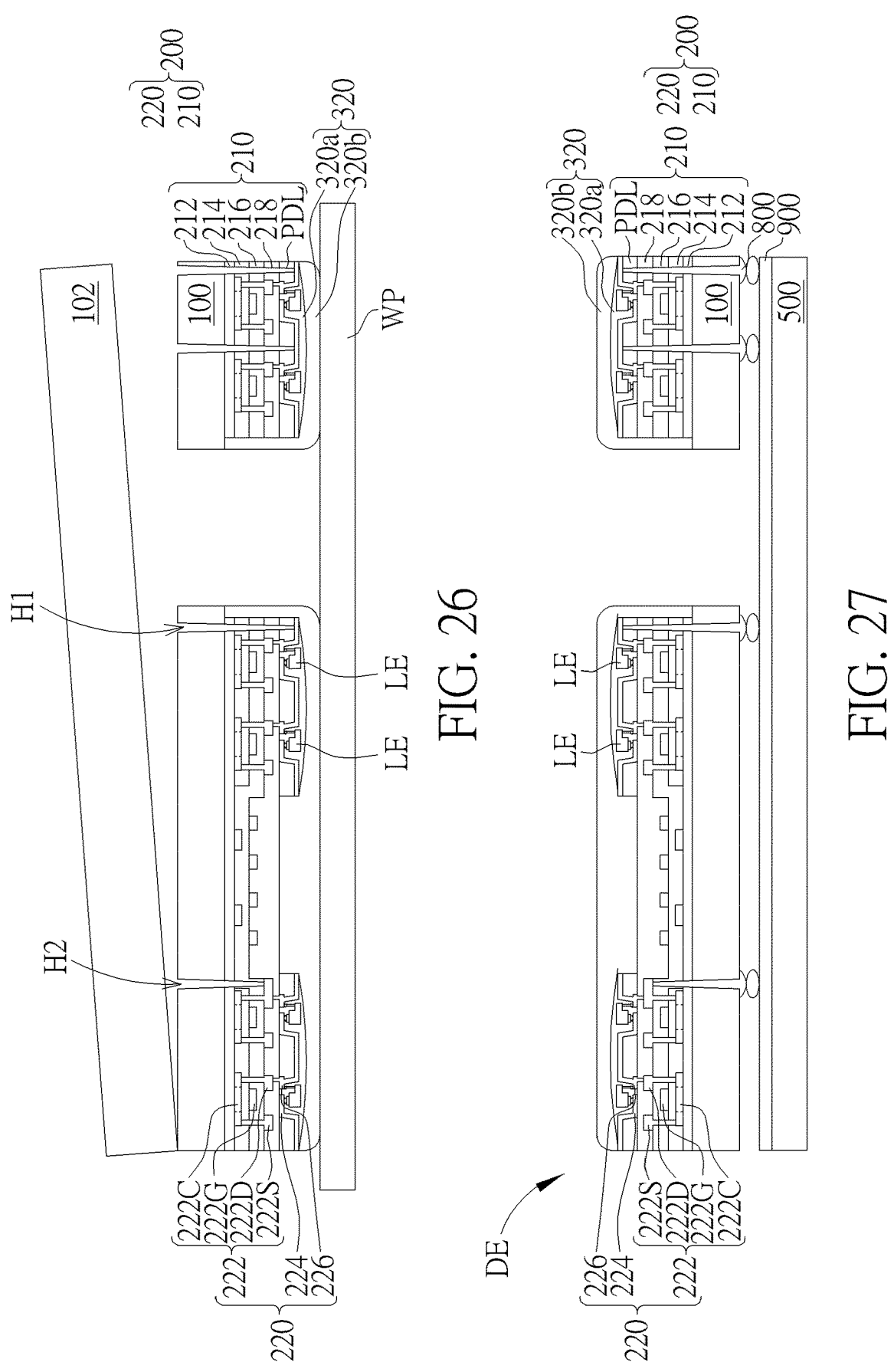
FIG. 26 and FIG. 27 are process schematic diagrams illustrating another part of the process of a method for manufacturing an electronic device according the present disclosure.

In some embodiments, after the encapsulation layer 310 is formed (as shown in FIG. 8), the whole structure including the carrier 102, the base layer 100, the patterned circuit layer 200 and the electronic element LE may be flipped and placed on a platform (e.g. the platform WP shown in FIG. 18 or FIG. 26). That is to say, the carrier 102, the base layer 100, the patterned circuit layer 200 and the electronic element LE may be flipped as a whole and then placed on the platform. Next, the step of removing the carrier 102 is performed on the platform. Then, the elastic substrate 500 is attached to the base layer 100. For example, the elastic substrate 500 may be attached to the base layer 100 through the adhesive layer 510, but not limited herein.

Figures 11, 12:
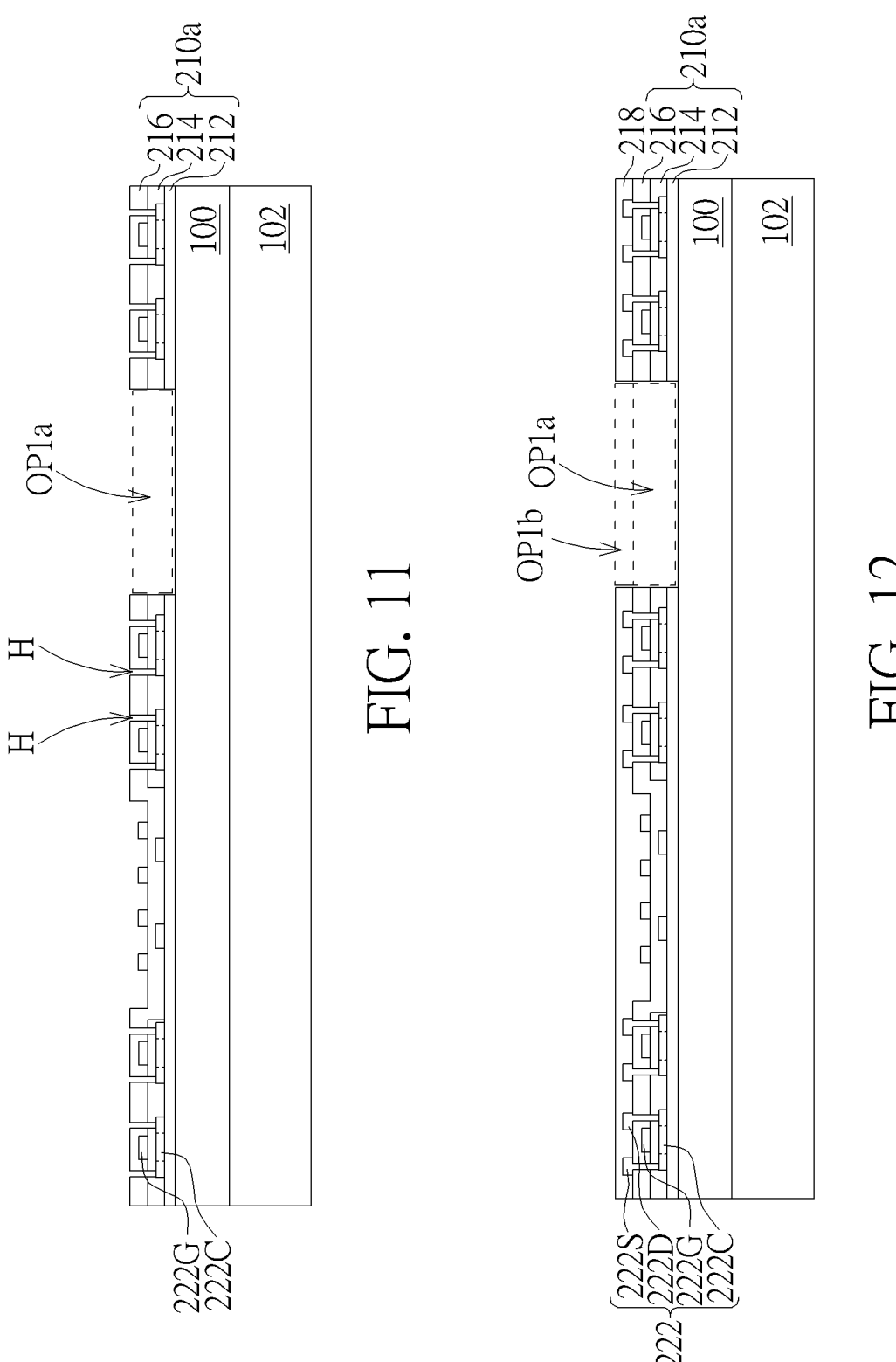
FIG. 11 to FIG. 13 are schematic diagrams illustrating a part of the process of a method for manufacturing an electronic device according the present disclosure.
Figure 13:
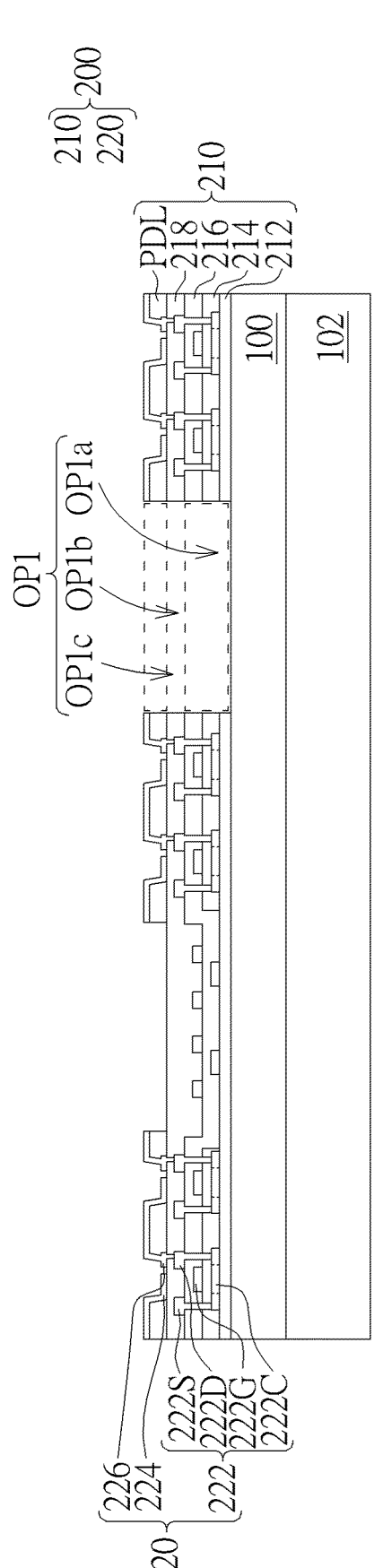

Please refer to FIG. 11 to FIG. 13. FIG. 11 to FIG. 13 are schematic diagrams illustrating a part of the process of a method for manufacturing an electronic device according the present disclosure. In some embodiments, the first opening OP is finally formed by forming the individual opening in each of the insulation layers step by step. As shown in FIG. 11 to FIG. 13, the step of forming the patterned circuit layer 200 may include the following sub-steps. An insulation layer 210a is formed on the base layer 100, and the insulation layer 210a (e.g., at least a portion of the insulation layer

210 described above) is patterned to form at least a part of the first opening OP. Then, a patterned conductive layer (including the source 222S and the drain 222D) is formed after the step of patterning the insulation layer 210a.

Please refer to FIG. 11 to FIG. 13. FIG. 11 to FIG. 13 are schematic diagrams illustrating a part of the process of a method for manufacturing an electronic device according the present disclosure. In some embodiments, the first opening OP1 is finally formed by forming the individual opening in each of the insulation layers step by step. As shown in FIG. 11 to FIG. 13, the step of forming the patterned circuit layer 200 may include the following sub-steps. An insulation layer 210a is formed on the base layer 100, and the insulation layer 210a (e.g., at least a portion of the insulation layer 210 described above) is patterned to form at least a part of the first opening OP1. Then, a patterned conductive layer (including the source 222S and the drain 222D) is formed after the step of patterning the insulation layer 210a.

In detail, as shown in FIG. 11, the insulation layer 210a, the channel layer 222C of the thin film transistor 222 and the gate 222G of the thin film transistor 222 are formed on the base layer 100. The insulation layer 210a may include the insulation layer 212 (e.g., a buffer layer), the insulation layer 214 and the insulation layer 216, the channel layer 222C may be disposed between the insulation layer 212 and the insulation layer 214, and the gate 222G may be disposed between the insulation layer 214 and the insulation layer 216, but not limited herein. Then, a part OP1a of the first opening OP1 (or referred to as a first sub-opening) and a connection hole H may be formed when the insulation layer 210a is patterned. The connection hole H may pass through the insulation layer 216 and the insulation layer 214 and expose a portion of the channel layer 222C. According to some embodiments, as shown in FIG. 11, the first sub-opening OP1a may be the opening in the insulation layer 212, the insulation layer 214 and the insulation layer 216, which may expose the base layer 100, but not limited herein. According to some embodiments, the first sub-opening OP1a may not expose the base layer 100.

Then, as shown in FIG. 12, the patterned conductive layer (including the source 222S and the drain 222D) is formed after the step of patterning the insulation layer 210a. Specifically, the insulation layer 218, the source 222S of the thin film transistor 222, the drain 222D of the thin film transistor 222 and wires (not shown) are formed after the step of patterning the insulation layer 210a. In some embodiments, the formed patterned conductive layer may include the source 222S, the drain 222D, the electrode connection layer 224 and/or the electrode connection layer 226 after the step of patterning the insulation layer 210a. The source 222S and the drain 222D may be filled in the connection hole H. Next, the insulation layer 218 may be patterned to form a part OP1b of the first opening OP1 (or referred to as a second sub-opening). Then, as shown in FIG. 13, a patterning process is performed to form the pixel definition layer PDL and a part OP1c of the first opening OP1 (or referred to as a third sub-opening), and the electrode connection layer 224 and electrode connection layer 226 are formed to form the element conductive layer 220. Thus, the step of forming the patterned circuit layer 200 having the first opening OP1 is completed. That is to say, the step of forming the patterned circuit layer 200 corresponding to this embodiment is to form the opening in each of the insulation layers step by step during the process of forming the thin film transistor 222, and thus the first opening OP is finally formed, but not limited herein.

In some embodiments, the first sub-opening OP1a, the second sub-opening OP1b and the third sub-opening OP1c may be aligned or misaligned with each other. In some embodiments, at least a portion of the first sub-opening OP1a, the second sub-opening OP1b and the third sub-opening OP1c may be communicated with each other.

The insulation layer 210 having three sub-openings (the first sub-opening OP1a, the second sub-opening OP1b and the third sub-opening OP1c) shown in FIG. 13 is only one of the examples, and the number of sub-openings in the present disclosure is not limited herein. Furthermore, it is only one of the examples that the first sub-opening OP1a is an opening in three insulation layers (the insulation layer 212, the insulation layer 214 and the insulation layer 216), but not limited herein. The sub-opening of the present disclosure may be an opening in one or plural insulation layer(s).

In some embodiments, as shown in FIG. 11 to FIG. 13 and FIG. 5 to FIG. 7, the insulation layer 210a (and/or the insulation layer 218, the pixel definition layer PDL) and the base layer 100 may be patterned by different processes. That is so say, the first opening OP1 and the second opening OP2 are formed by different processes. In some embodiments, the insulation layer 210a (and/or the insulation layer 218, the pixel definition layer PDL) is patterned by an etching process, and the base layer 100 is patterned by a laser drilling process or a punch process.

Figure 14:
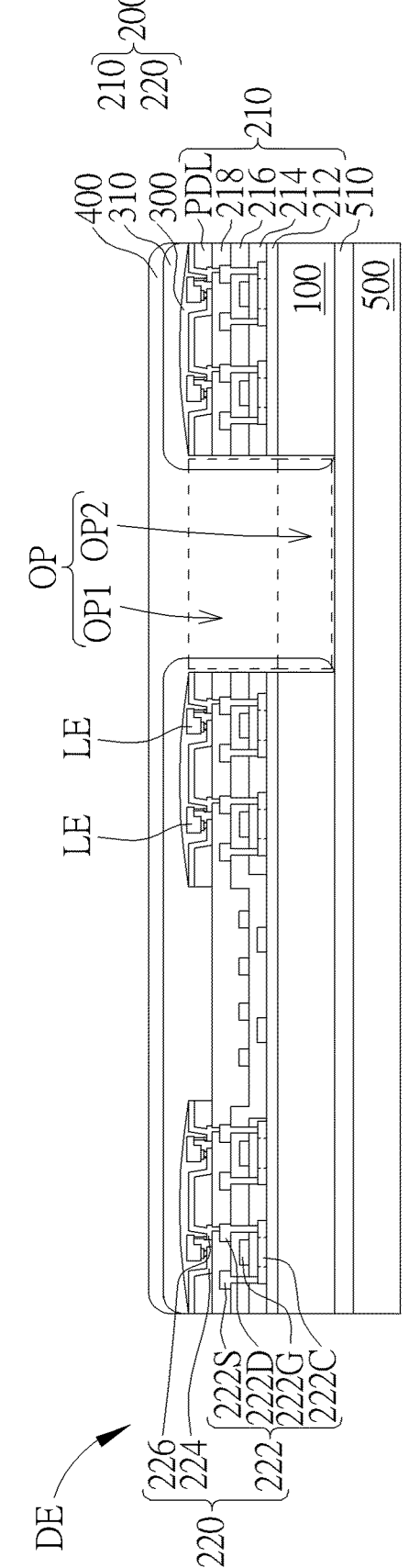
FIG. 14 is a schematic diagram illustrating another part of the process of a method for manufacturing an electronic device according the present disclosure.

Please refer to FIG. 14. FIG. 14 is a schematic diagram illustrating another part of the process of a method for manufacturing an electronic device according the present disclosure. In some embodiments, as shown in FIG. 14, the method of the present disclosure may further include filling an elastic material 400 in the first opening OP1 and the second opening OP2 after the step S400 of patterning the base layer 100 (as shown in FIG. 7). For example, the elastic material 400 may be filled in the first opening OP1 and the second opening OP2 and cover the encapsulation layer 310 after the base layer 100 is patterned and the encapsulation layer 300 and the encapsulation layer 310 are formed. Compared with the base layer 100, the elastic material 400 may have a lower Young's modulus and a higher failure strain. For example, the elastic material 400 may include a compound containing carbon, hydrogen, oxygen and/or silicon. The elastic material 400 may include, for example, polydimethylsiloxane (PDMS), poly(methyl methacrylate) (PMMA), polylactic acid (PLA) or acrylonitrile butadiene styrene (ABS), but not limited herein. Furthermore, the sub-carrier 104 may be placed on the elastic material 400 after the elastic material 400 is formed. For example, the sub-carrier 104 may be attached to the surface of the elastic material 400. Then, the carrier 102 may be removed. Next, the elastic substrate 500 is attached under the base layer 100 and the elastic material 400 through the adhesive layer 510, and a portion of the adhesive layer 510 may correspond to the substrate opening OP, which is formed of the first opening OP1 and the second opening OP2. Then, the sub-carrier 104 may be removed, thereby forming the electronic device DE as shown in FIG. 14.

Figure 15:
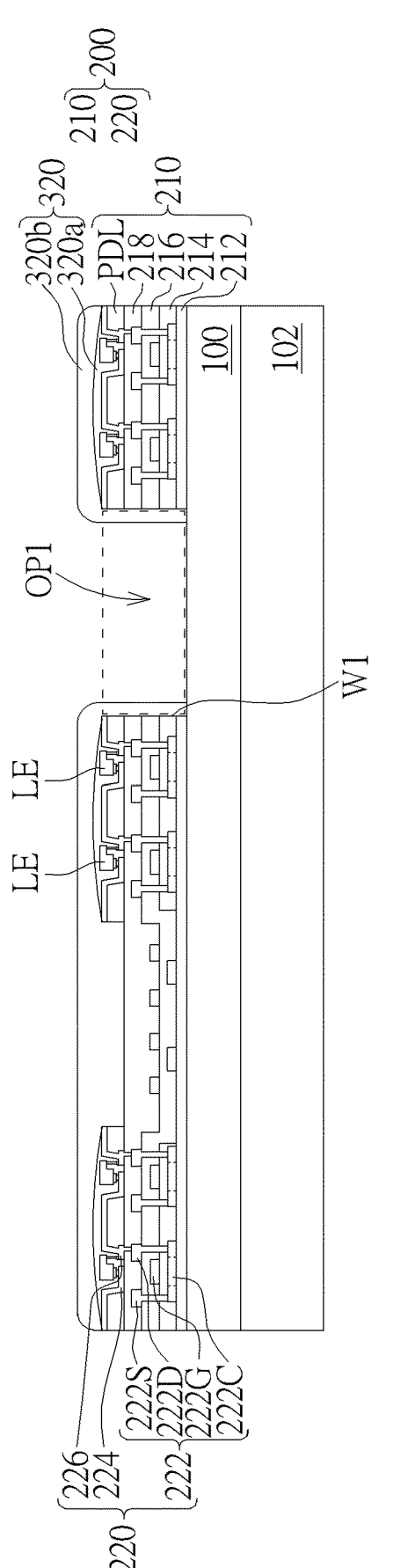
FIG. 15 and FIG. 16 are schematic diagrams illustrating another part of the process of a method for manufacturing an electronic device according the present disclosure.
Figure 16:
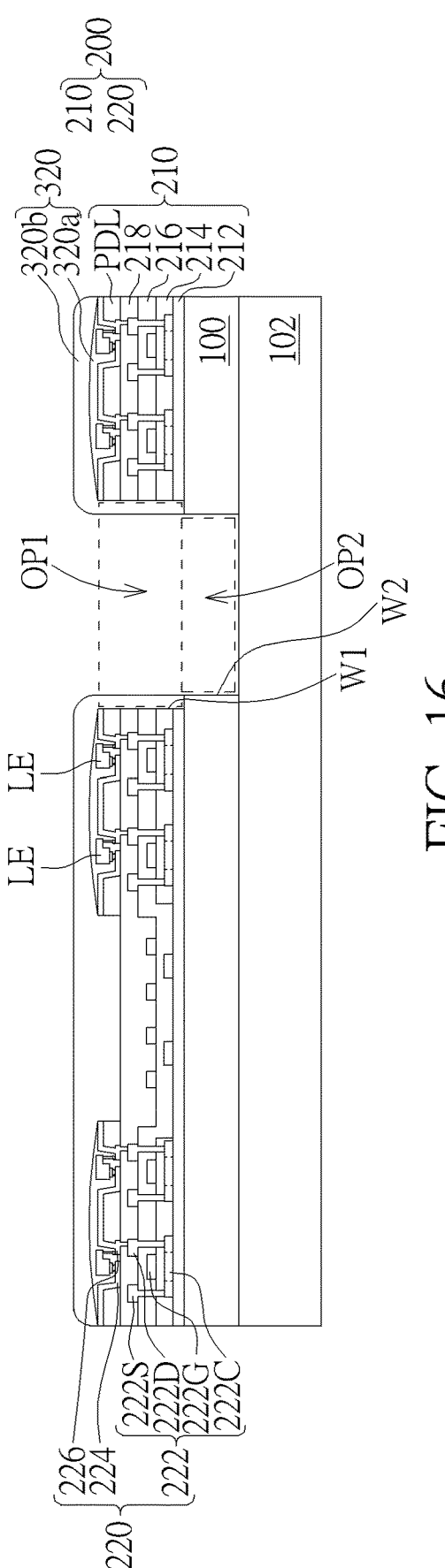

Please refer to FIG. 15 and FIG. 16. FIG. 15 and FIG. 16 are schematic diagrams illustrating another part of the process of a method for manufacturing an electronic device according the present disclosure, and the steps shown in FIG. 15 and FIG. 16 may be performed after the step shown in FIG. 5. As shown in FIG. 15, the method of the present disclosure may further include forming an encapsulation layer 320 (or referred to as a first encapsulation layer) on the electronic element LE to cover the electronic element LE before the step of patterning the base layer 100, and the encapsulation layer 320 further covers a sidewall W1 of the first opening OP1, a portion of the upper surface of the base layer 100 and the patterned circuit layer 200 to protect the electronic element LE and the patterned circuit layer 200. The encapsulation layer 320 may include organic materials, inorganic materials or a stacking structure of organic and inorganic materials, but not limited herein. In some embodiments, the material of an encapsulation portion 320a of the encapsulation layer 320 covering the electronic element LE may be the same as or different from the material of an encapsulation portion 320b of the encapsulation layer 320 covering the sidewall W1. If the encapsulation portion 320a and the encapsulation portion 320b include the same material, the encapsulation portion 320a and the encapsulation portion 320b may be formed in the same step. That is to say, the encapsulation portion 320a and the encapsulation portion 320b of the encapsulation layer 320 may be formed as a whole. If the encapsulation portion 320a and the encapsulation portion 320b include different materials, the encapsulation portion 320b of the encapsulation layer 320 is formed on the electronic element LE and the sidewall W1 of the first opening OP1 after the encapsulation portion 320a of the encapsulation layer 320 is formed on the electronic element LE, so as to protect and cover the electronic element LE and the patterned circuit layer 200, but not limited herein. Next, as shown in FIG. 16, the base layer 100 is patterned to form the second opening OP2 communicating with the first opening OP1. During the process of patterning the base layer 100 to form the second opening OP2, the encapsulation layer 320 may have a function of protection since the encapsulation layer 320 covers the sidewall W1 of the first opening OP1 and a portion of the upper surface of the base layer 100. As shown in FIG. 16, the encapsulation portion 320b exists on the sidewall W1 of the first opening OP1, and there is no encapsulation layer on the sidewall W2 of the second opening OP2.

In some embodiments, not shown in the figures but may be realized by referring to other embodiments, the whole structure may further be flipped after the encapsulation layer 320 is formed and the base layer 100 is patterned (as shown in FIG. 16), and then the carrier 102 may be removed. Next, the elastic substrate 500 is attached to the base layer 100. For example, the adhesive layer 510 may be formed on the elastic substrate 500 first, and then the elastic substrate 500 is attached to the base layer 100 through the adhesive layer 510. Then, the elastic material 400 may be filled in the first opening OP1 and the second opening OP2 and cover the encapsulation layer 320, but not limited herein.

Figure 19:
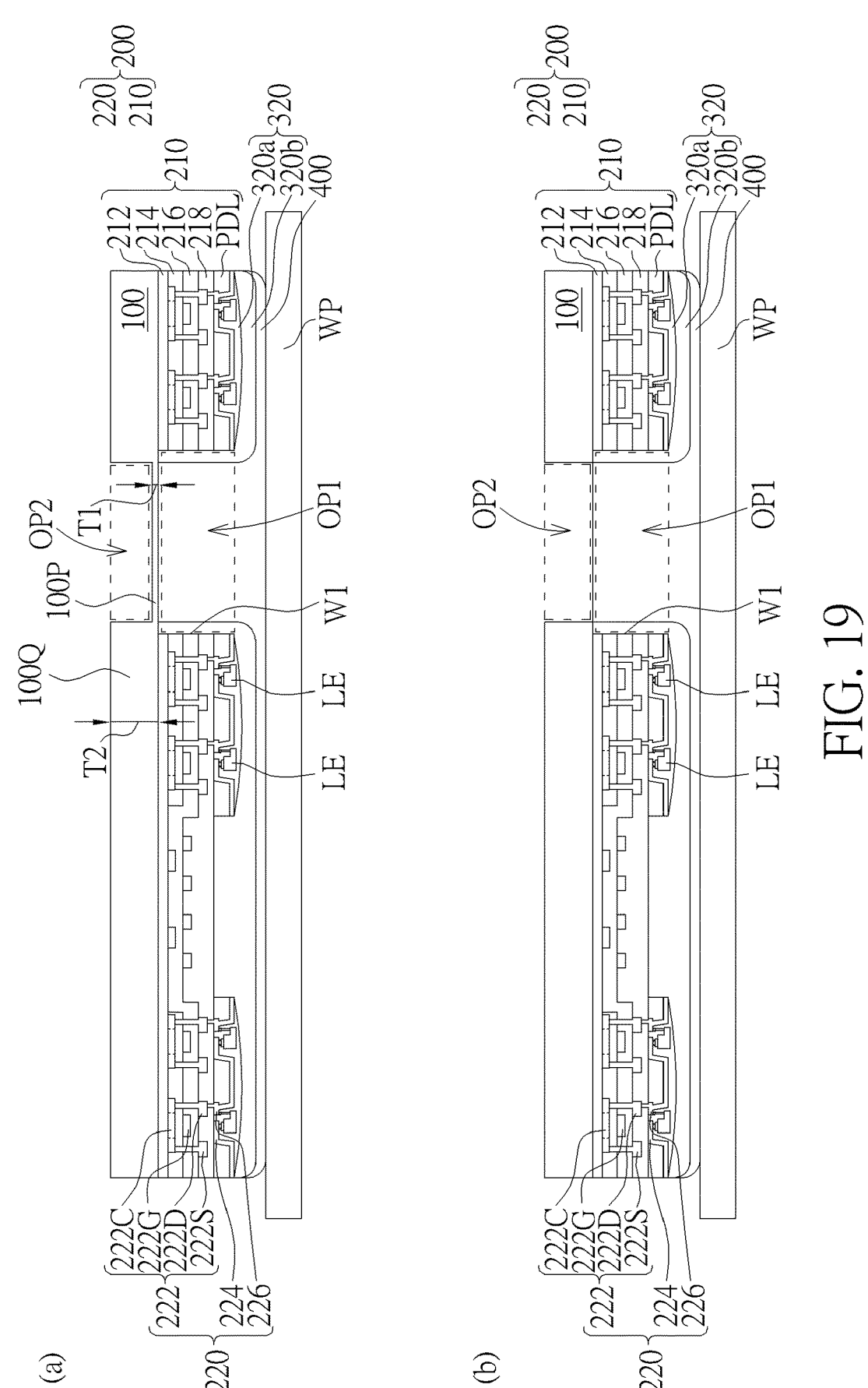
Figure 20:
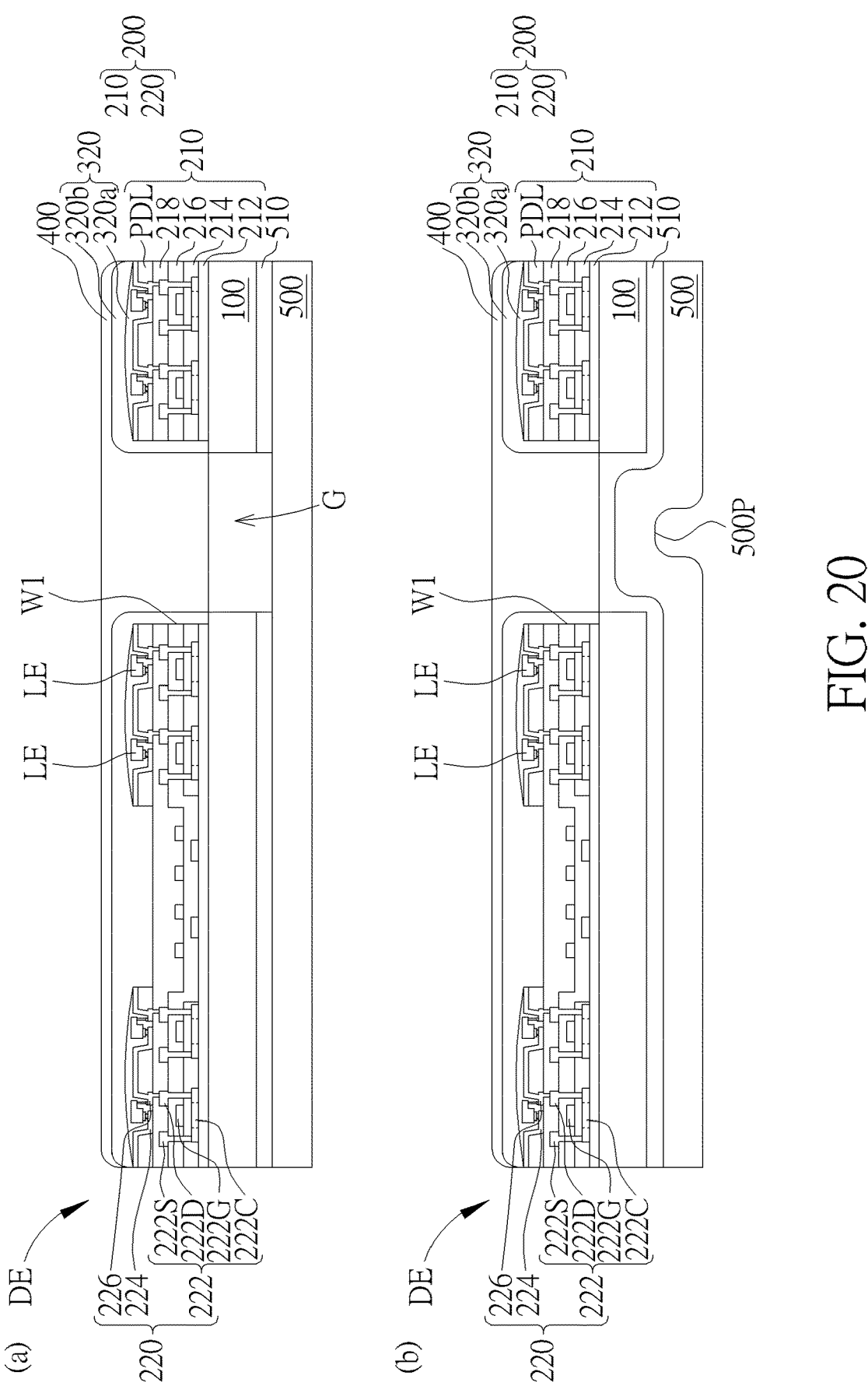

Please refer to FIG. 17 to FIG. 20. FIG. 17 to FIG. 20 are process schematic diagrams illustrating another part of the process of a method for manufacturing an electronic device according the present disclosure. In some embodiments, as shown in FIG. 17 to FIG. 20, the method for manufacturing the electronic device of the present disclosure may further include filling an elastic material 400 in the first opening OP1, and the step of patterning the base layer 100 is performed after the step of filling the elastic material 400 in the first opening OP1. Specifically, as shown in FIG. 17, the elastic material 400 is filled in the first opening OP1, and the elastic material 400 covers the encapsulation layer 320. Then, as shown in FIG. 18, the whole structure may be flipped upside-down, so as to perform the step of removing the carrier 102 on a platform WP. Through filling the elastic material 400 first and then removing the carrier 102, the whole structure of the electronic device DE may be more stable, and the base layer 100 may not crack when the carrier 102 is removed. Then, as shown in FIG. 19, the base layer 100 is patterned to form at least a part of the second opening OP2. Then, as shown in FIG. 20, the elastic substrate 500 is attached to the base layer 100. For example, the adhesive layer 510 may be formed on the elastic substrate 500 first, and then the elastic substrate 500 is attached to the base layer 100 through the adhesive layer 510.

In some embodiments, as shown in example (a) of FIG. 19, in the step of patterning the base layer 100, a portion of the base layer 100 corresponding to the first opening OP1 may be removed, so that the base layer 100 has a recessed portion 100P. The recessed portion 100P corresponds to the first opening OP1 and has a thickness T1. The other portions of the base layer 100, for example, the portions of the base layer 100 corresponding to disposition of the electronic element LE or the portions not corresponding to the first opening OP1, are a non-recessed portion 100Q, and the non-recessed portion 100Q has a thickness T2. In the base layer 100, the thickness T1 of the recessed portion 100P may be less than the thickness T2 of the non-recessed portion 100Q. According to some embodiments, the thickness T1 may be less than one fifth of the thickness T2 (i.e., $T1 < \frac{1}{5} * T2$). The base layer 100 thus forms a second opening OP2 which is at least partially overlapped with the first opening OP1 through the recessed portion 100P of the base layer 100, but not limited herein. In some embodiments, as shown in example (b) of FIG. 19, in the step of patterning the base layer 100, the base layer 100 corresponding to the first opening OP1 may be completely removed to form a second opening OP2 which is communicated with the first opening OP1, but not limited herein.

In some embodiments, as shown in example (a) of FIG. 20, after the base layer 100 is patterned to form the second opening OP2 (as shown in example (b) of FIG. 19), the elastic substrate 500 may be attached to the base layer 100 through the adhesive layer 510, and the adhesive layer 510 may not be provided at the place corresponding to the second opening OP2 of the base layer 100, so a gap G exists between the elastic substrate 500 and the elastic material 400, but not limited herein. In some embodiments, as shown in example (b) of FIG. 20, after the base layer 100 is patterned to form the second opening OP2 (as shown in example (b) of FIG. 19), the elastic substrate 500 may be attached to the base layer 100 and the elastic material 400 through the adhesive layer 510, so that the adhesive layer 510 is disposed between the base layer 100 and the elastic substrate 500. According to some embodiments, the adhesive layer 510 may be disposed between the elastic material 400 and the elastic substrate 500 at the place corresponding to the second opening OP2, and the elastic substrate 500 may be adhered to the elastic material 400 through the adhesive layer 510. Thus, as shown in example (b) of FIG. 20, the elastic substrate 500 may have a recess 500P at the place corresponding to the second opening OP2, but not limited herein.

Figures 21, 22:
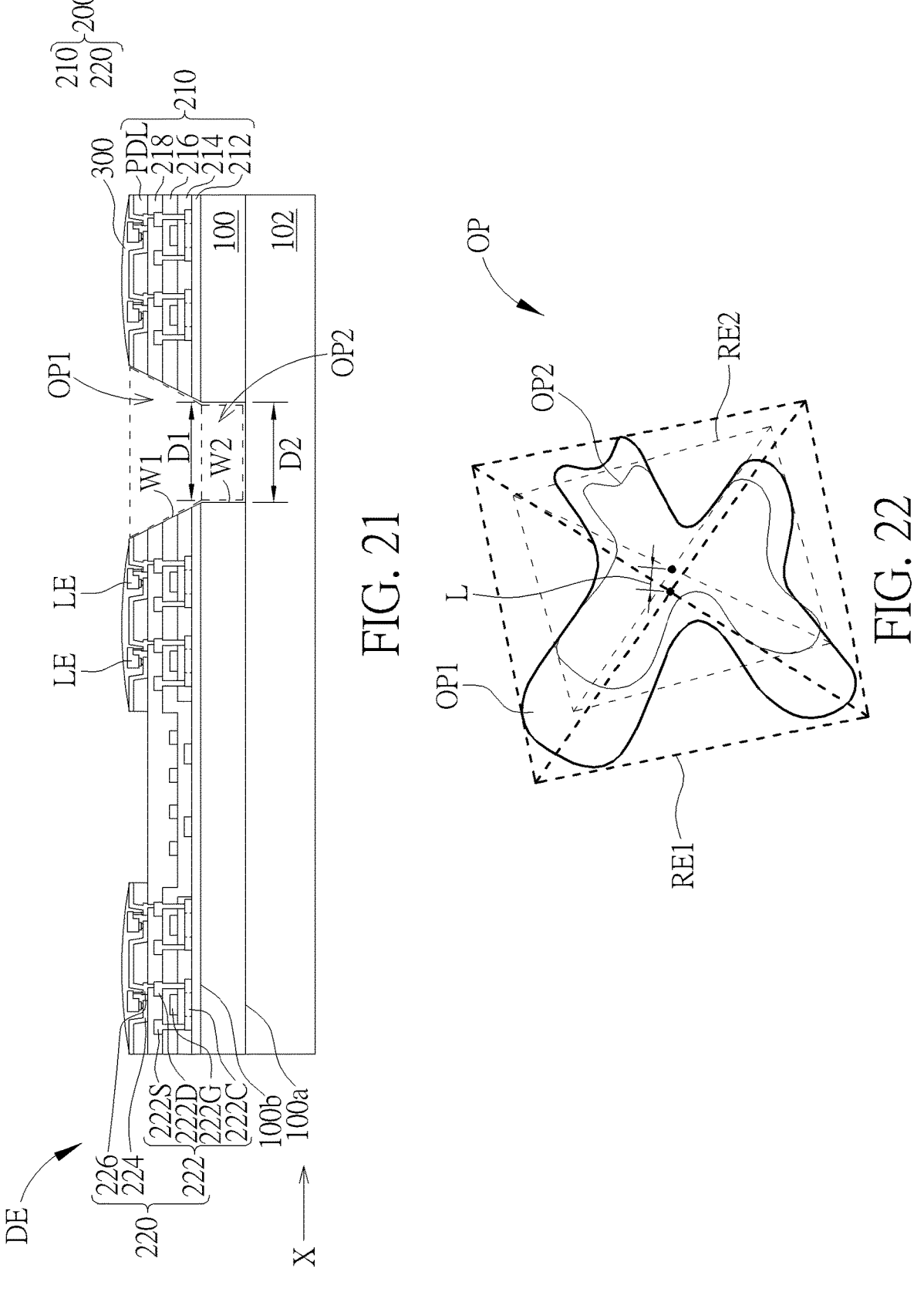
FIG. 21 is a cross-sectional view schematic diagram of a first opening and a second opening of an electronic device according to an embodiment of the present disclosure.
FIG. 22 is a top-view schematic diagram of a first opening and a second opening of an electronic device according to an embodiment of the present disclosure.

Please refer to FIG. 21. FIG. 21 is a cross-sectional view schematic diagram of a first opening and a second opening of an electronic device according to an embodiment of the present disclosure. In some embodiments, as shown in FIG. 21, the sidewall W1 of the first opening OP1 may be an inclined wall in a cross-sectional view direction. That is to say, the width of the first opening OP1 may gradually decrease from a side of the patterned circuit layer 200 away from the base layer 100 to a side of the patterned circuit layer 200 adjacent to the base layer 100. The minimum width of the first opening OP1 measured in a direction X is a width D1. The direction X may be substantially parallel to the upper surface 100b of the base layer 100, and the patterned circuit layer 200 is disposed on the upper surface 100b of the base layer 100. The sidewall W2 of the second opening OP2 may be substantially perpendicular to the direction X, and the width of the second opening OP2 measured in the direction X is a width D2. The width D2 of the second opening OP2 may be equal to or less than the width D1 of the first opening OP1. FIG. 21 shows an embodiment that the width D2 is substantially equal to the width D1, but not limited herein. In other embodiments, the width D2 of the second opening OP2 may be less than the width D1 of the first opening OP1. The first opening OP1 may be formed, for example, by an etching process, and the second opening OP2 may be formed, for example, by a laser drilling process.

Please refer to FIG. 2 and FIG. 22. FIG. 22 is a top-view schematic diagram of a first opening and a second opening of an electronic device according to an embodiment of the present disclosure. As shown in example (a), example (b) and example (c) of FIG. 2 and FIG. 22, the substrate opening OP of the electronic device DE is composed of the first opening OP1 and the second opening OP2 which are formed in separate steps, and the first opening OP1 and the second opening OP2 formed in separate steps correspond to each other in position. The distance between the center points of two adjacent island portions P1 of the electronic device DE is defined as a distance d, and the relative offset of the first opening OP1 and the second opening OP2 in position is defined as an offset L. The offset L is less than half of the distance d (i.e., $L < \frac{1}{2}d$), so that the abnormal condition of wires or lines in the structure may be reduced. The measurement method of the offset L is, for example, the distance between the center of the diagonals of the smallest rectangle RE1 that may surround the first opening OP1 and the center of the diagonals of the smallest rectangle RE2 that may surround the second opening OP2.

Figure 23:
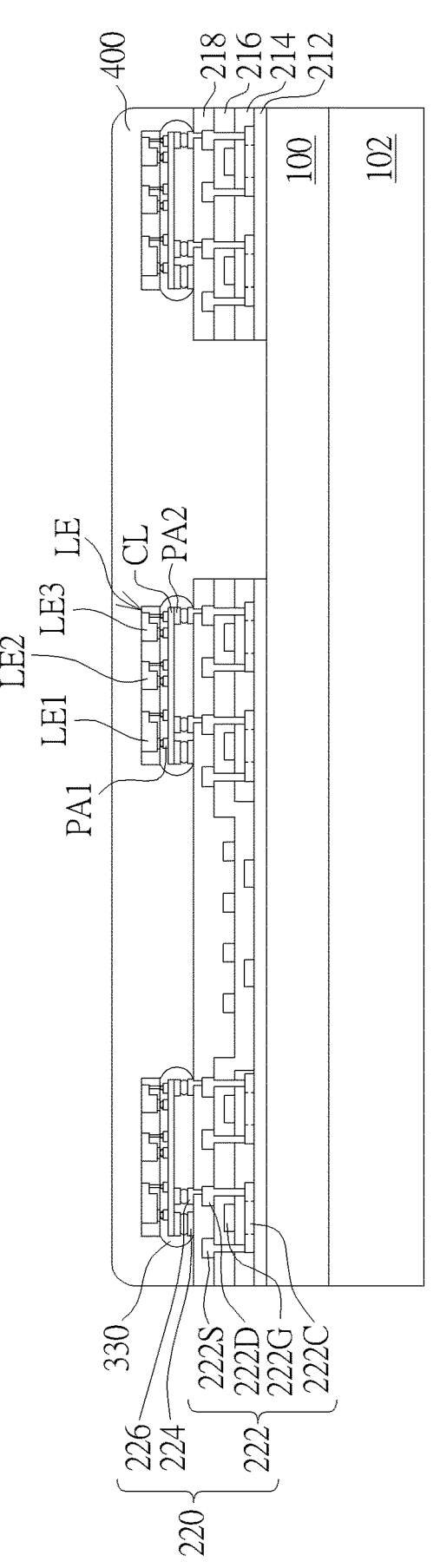
FIG. 23 is a schematic diagram illustrating a part of the manufacturing process of an electronic device according an embodiment the present disclosure.

Please refer to FIG. 2 and FIG. 23. FIG. 23 is a schematic diagram illustrating a part of the manufacturing process of an electronic device according an embodiment the present disclosure. As shown in example (c) of FIG. 2 and FIG. 23, the electronic element LE may be an integrated light-emitting diode and include a first light-emitting unit LE1, a second light-emitting unit LE2 and a third-light emitting unit LE3. The size of the first light-emitting unit LE1 may be greater than the size of the second light-emitting unit LE2 and the size of the third light-emitting unit LE3. According to some embodiments, the first light-emitting unit LE1 may be a red light-emitting unit, the second light emitting unit LE2 may be a green light-emitting unit, and the third light-emitting unit LE3 may be a blue light-emitting unit, but the present disclosure is not limited to the above. For example, the selection of the colors of the first light-emitting unit LE1, the second light-emitting unit LE2 and the third light-emitting unit LE3 is not limited to the above. Furthermore, the size of the electronic element LE with the integrated light-emitting diodes may be less than the size of the island portion P1.

As shown in FIG. 23, in the electronic element LE with the integrated light-emitting diodes, the first light-emitting unit LE1, the second light-emitting unit LE2 and the third light-emitting unit LE3 may be electrically connected to a circuit layer CL through connection pads PA1, so that the first light-emitting unit LE1, the second light-emitting unit LE2 and the third light-emitting unit LE3 may have a corresponding connection relationship through the circuit layer CL. Furthermore, the connection pads PA1 may be integrated into connection pads PA2 through the circuit layer CL to be electrically connected to the patterned circuit layer 200, thereby reducing the number of connection pads. Since the integrated light-emitting diode (electronic element LE) has been packaged, there may be no pixel definition layer provided on the patterned circuit layer 200 electrically connected to the electronic element LE. In some embodiments, as shown in FIG. 23, the connection pads PA1, the circuit layer CL and the connection pads PA2 may further be encapsulated by an encapsulation layer 330 for protection, but not limited herein. In other embodiments, the encapsulation layer 330 may not be provided. In addition, the elastic material 400 may further be formed to cover the electronic element LE and the patterned circuit layer 200.

Figure 24:
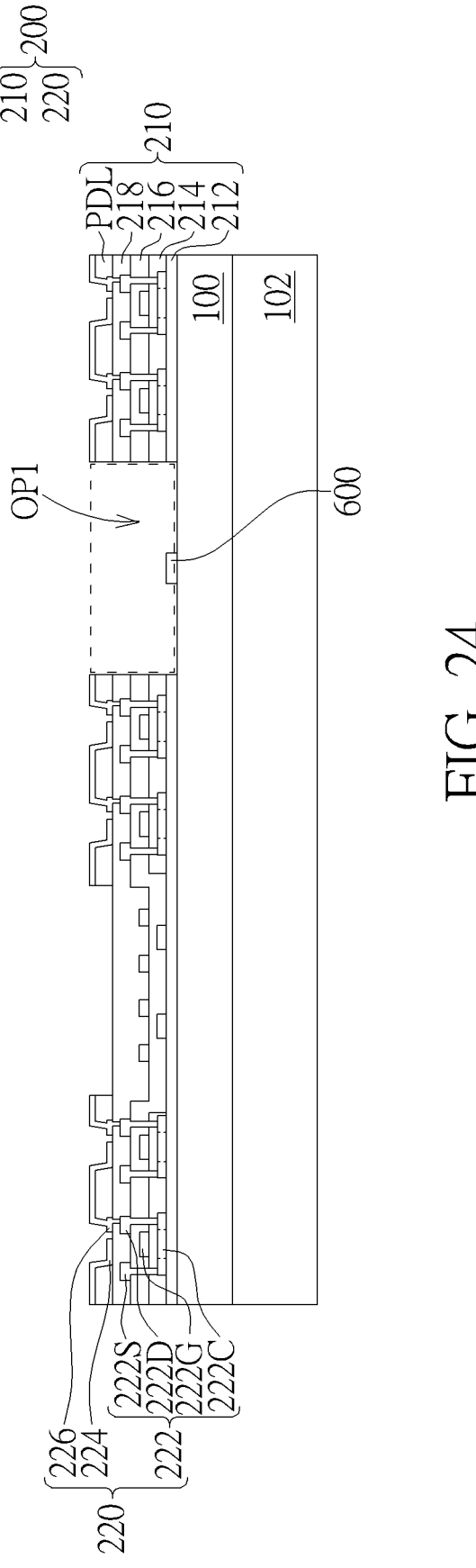
FIG. 24 is a process schematic diagram illustrating another part of the process of a method for manufacturing an electronic device according the present disclosure.

Please refer to FIG. 24. FIG. 24 is a process schematic diagram illustrating another part of the process of a method for manufacturing an electronic device according the present disclosure. In some embodiments, as shown in FIG. 24, after the step S200 of forming the patterned circuit layer 200 having the first opening OP1 (as shown in FIG. 4 or FIG. 13), an alignment element 600 may further be formed in the first opening OP1 for alignment in the subsequent transfer of the electronic element LE, but not limited herein. In other embodiments, the alignment element 600 may further be formed on other portions of the patterned circuit layer 200 (e.g., the portions of the patterned circuit layer 200 corresponding to the island portions P1 shown in FIG. 2) to improve the accuracy of alignment in the manufacturing process. In some embodiments, the alignment element 600 may be removed by subsequent processes. For example, the alignment element 600 may be removed in the step S400 of patterning the base layer 100 to form the second opening OP2, but not limited herein. In other embodiments, the alignment element 600 may not be removed, and the alignment element is remained in the structure of the electronic device.

Figure 25:
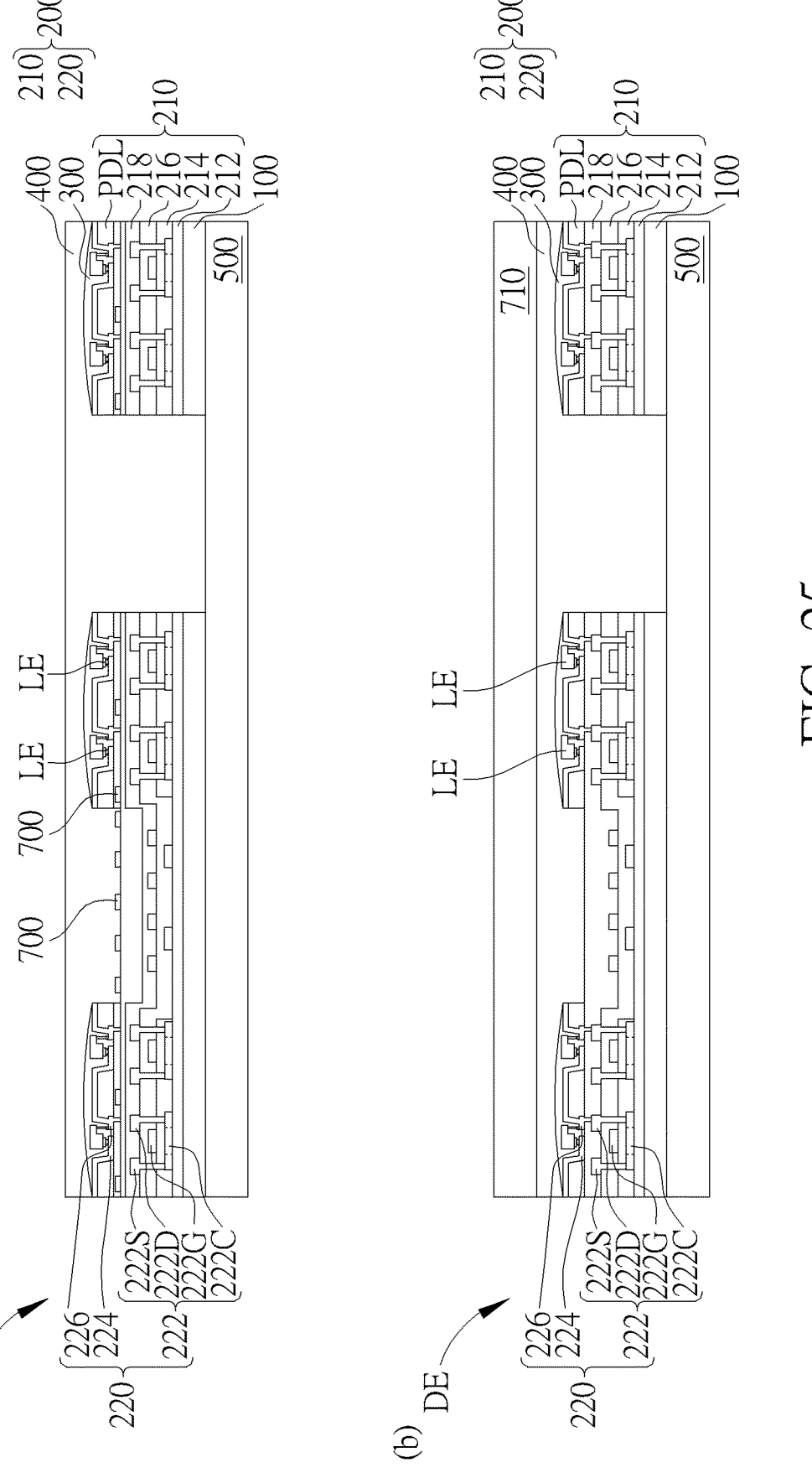
FIG. 25 is a partial cross-sectional view schematic diagram of an electronic device according to different embodiments of the present disclosure.

Please refer to FIG. 25. FIG. 25 is a cross-sectional view schematic diagram of an electronic device according to different embodiments of the present disclosure. In some embodiments, as shown in example (a) of FIG. 25, a plurality of touch elements 700 may further be disposed in the electronic device DE to form a touch in display. For example, the touch elements 700 may be disposed on the insulation layer 218, but not limited herein. In some embodiments, a stretchable touch film 710 may further be disposed in the electronic device DE to form a touch electronic device. For example, as shown in example (b) of FIG. 25, the elastic substrate 500 may be disposed under the base layer 100, and the stretchable touch film 710 may be disposed on the elastic material 400. Alternatively, in variation embodiments, the stretchable touch film 710 with elasticity may be disposed under the base layer 100, but not limited herein.

Please refer to FIG. 26 and FIG. 27. FIG. 26 and FIG. 27 are process schematic diagrams illustrating another part of the process of a method for manufacturing an electronic device according the present disclosure. In some embodiments, as shown in FIG. 26, after the encapsulation layer 320 is formed (as shown in FIG. 16), the whole structure may further be flipped, so as to remove the carrier 102 on the platform WP. Furthermore, connection holes H1 and connection holes H2 may be formed in the base layer 100 and the patterned circuit layer 200 after the carrier 102 is removed. For example, the connection holes H1 and the connection holes H2 may be formed by a laser drilling process. Then, as shown in FIG. 27, a metal material 800 may be filled in the connection holes H1 and the connection holes H2. The electronic element LE may be electrically connected to a circuit layer 900 disposed on the elastic substrate 500 through the connection hole H1, and the thin film transistor 222 in the patterned circuit layer 200 may be electrically connected to the circuit layer 900 disposed on the elastic substrate 500 through the connection hole H2. For example, the metal material 800 may be filled in the connection holes H1 and the connection holes H2 by an electroplating process, but not limited herein.

From the above description, according to the method for manufacturing the electronic device of the present disclosure, the electronic element is placed on the patterned circuit layer after the patterned circuit layer is formed. According to some embodiments, the adverse effects on the electronic element may be mitigated when the patterned circuit layer is formed. Therefore, the manufactured electronic device may have a better qualification rate.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. A method for manufacturing an electronic device, comprising:
   providing a base layer;
   forming a patterned circuit layer on the base layer, the patterned circuit layer having a first opening;
   placing an electronic element on the patterned circuit layer; forming a first encapsulation portion on the electronic element after the step of placing the electronic element;
   forming a second encapsulation portion on the first encapsulation portion and a sidewall of the first opening; and
   patterning the base layer to form a second opening which is at least partially overlapped with the first opening after the step of forming the second encapsulation portion;
   wherein the step of placing the electronic element is performed after the step of forming the patterned circuit layer.

2. The method according to claim 1, wherein the step of forming the patterned circuit layer comprises:
   forming an insulation layer on the base layer;
   forming a patterned conductive layer on the insulation layer; and
   patterning the insulation layer to form at least a part of the first opening after the step of forming the patterned conductive layer.

3. The method according to claim 2, wherein the insulation layer and the base layer are patterned by different processes.

4. The method according to claim 3, wherein the insulation layer is patterned by an etching process, and the base layer is patterned by a laser drilling process.

5. The method according to claim 1, wherein the step of forming the patterned circuit layer comprises:
   forming an insulation layer on the base layer;
   patterning the insulation layer to form at least a part of the first opening; and
   forming a patterned conductive layer after the step of patterning the insulation layer.

6. The method according to claim 5, wherein the insulation layer and the base layer are patterned by different processes.

7. The method according to claim 6, wherein the insulation layer is patterned by an etching process, and the base layer is patterned by a laser drilling process.

8. The method according to claim 1, further comprising filling an elastic material in the first opening.

9. The method according to claim 8, wherein the step of patterning the base layer is performed after the step of filling the elastic material in the first opening.

10. The method according to claim 1, further comprising filling an elastic material in the first opening and the second opening after the step of patterning the base layer.

11. The method according to claim 1, further comprising:

providing a carrier;

attaching the base layer on the carrier;

flipping the carrier and the base layer as a whole;

removing the carrier; and attaching an elastic substrate under the base layer.

12. The method according to claim 1, wherein the first opening is communicated with the second opening.

\* \* \* \* \*